(12) United States Patent
Miyachi et al.

(10) Patent No.: US 7,544,960 B2
(45) Date of Patent: Jun. 9, 2009

(54) EVALUATION METHOD AND FABRICATION METHOD OF OPTICAL ELEMENT HAVING MULTILAYER FILM, EXPOSURE APPARATUS HAVING THE MULTILAYER FILM, AND DEVICE FABRICATION METHOD

(75) Inventors: Takeshi Miyachi, Utsunomiya (JP); Akira Miyake, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 810 days.

(21) Appl. No.: 11/124,000

(22) Filed: May 6, 2005

(65) Prior Publication Data

US 2005/0271957 A1  Dec. 8, 2005

(30) Foreign Application Priority Data

May 7, 2004  (JP)  ............... 2004-139060

(51) Int. Cl.
*G03B 21/00*  (2006.01)
*G01B 11/24*  (2006.01)

(52) U.S. Cl. .................. 250/504 R; 430/5; 355/53; 355/77

(58) Field of Classification Search .................. None
See application file for complete search history.

(56) References Cited

U.S. PATENT DOCUMENTS 6,355,381 B1 * 3/2002 Yan et al. ................. 430/5
6,479,195 B1 * 11/2002 Kirchauer et al. ............. 430/5
6,607,862 B2 * 8/2003 Yan et al. .................. 430/5
6,610,447 B2 * 8/2003 Yan et al. .................. 430/5
6,756,163 B2 * 6/2004 Yan ......................... 430/5
6,908,713 B2 * 6/2005 Silverman .................. 430/5
7,083,290 B2 * 8/2006 Masaki et al. ............. 353/122
7,280,184 B2 * 10/2007 Hasegawa et al. ........... 355/53
2002/0044287 A1  4/2002 Otaki
2003/0081722 A1 * 5/2003 Kandaka et al. ............ 378/70

FOREIGN PATENT DOCUMENTS

JP  2000-55841 A  2/2000
JP  2000-97620 A  4/2000
JP  2002-243669 A  8/2002

OTHER PUBLICATIONS

M. Malinowshi et al.; "Controlling Contamination in Mo/Si Multiplayer Mirrors by Si Surface-capping Modifications"; *Proceedings of SPIE*; vol. 4688; (Jul. 2002); pp. 442-453.

(Continued)

*Primary Examiner*—David A. Vanore
(74) *Attorney, Agent, or Firm*—Locke Lord Bissell & Liddell LLP

(57) ABSTRACT

A fabrication method of an optical element having a multilayer film includes the steps of forming a multilayer film on a substrate, measuring a secondary radiation radiated from the multilayer film when a light with a wavelength of 2 to 40 nm is irradiated to the multilayer film, determining a phase difference between the light irradiated to the multilayer film and the light reflected from the multilayer film based on a measurement result of the measuring step, and modifying the multilayer film based on the determined phase difference.

12 Claims, 25 Drawing Sheets

OTHER PUBLICATIONS

M. Yamamoto; "SUB-nm Figure Error Corrrection of an EUV multilayer Mirror by its Surface Milling"; *Nuclear Instruments and Method in Physics Research A*.; (2001); pp. 1282-1285.

Y. Nakai et al.; "Stopping Power of Matter for Electrons Below 10keV"; *Applied Physics*; vol. 51, Section 3; (Mar. 1982); pp. 279-282 ;with English translation (8 pages).

J. H. Underwood et al.; "Layered Synthetic Microstructures as Bragg Diffractors for X-rays and Extreme Ultraviolet: Theory and Predicted Performance"; *Applied Optics*; vol. 20, No. 17; (Sep. 1, 1981); pp. 3027-3034.

* cited by examiner

EVALUATION METHOD AND FABRICATION METHOD OF OPTICAL ELEMENT HAVING MULTILAYER FILM, EXPOSURE APPARATUS HAVING THE MULTILAYER FILM, AND DEVICE FABRICATION METHOD

BACKGROUND OF THE INVENTION

The present invention relates generally to a fabrication method of an optical element, and more particularly to an evaluation and fabrication method of an optical element having a multilayer film (for example, a multilayer mirror and reflection-type mask). Moreover, the present invention relates to an exposure apparatus having the optical element and a device fabrication method using the exposure apparatus.

Reduction projection exposures using ultraviolet have been conventionally employed to manufacture such a fine semiconductor device as a semiconductor memory and a logic circuit in lithography technology. However, the lithography using the ultraviolet light has the limit to satisfy the rapidly promoting fine processing of a semiconductor device. Therefore, an exposure apparatus using extreme ultraviolet ("EUV") light with a wavelength of approximately 13.5 nm shorter than that of the ultraviolet (referred to as an "EUV exposure apparatus" hereinafter) has been developed to efficiently transfer very fine circuit patterns of 50 nm or less.

The EUV exposure apparatus uses a reflection-type optical element such as a mirror for an optical system, and a multilayer film that alternately forms or layers two kinds of materials having different optical constants is formed on a surface of the reflection-type optical element. The multilayer film is formed by alternately forming or layering molybdenum (Mo) layer and silicon (Si) layer on a precisely polished glass plate. The thickness of the layer is decided according to the wavelength of the exposure light etc., and for example, a Mo layer is about 3 nm thickness, and a Si layer is about 4 nm thickness. A sum of the thicknesses of two kinds of materials is generally called a coating cycle, which is 7 nm in the above example.

The multilayer mirror reflects EUV light with a specific wavelength when receiving EUV light. Efficiency reflected EUV light is one within a narrow bandwidth around λ that satisfies an interference condition where λ is a wavelength of the reflected EUV light, θ is an incident angle and d is a coating cycle and the bandwidth is about 0.6 to 1 nm. The interference condition is approximately expressible by Bragg's equation (Equation 1), but it shifts minutely from a value obtained from this equation solely due to an influence of refraction in the material etc.

$$2 \times d \times \cos \theta = \lambda \qquad (1)$$

The multilayer mirror in the projection optical system requires very high precision for its surface shape. For example, a permissible figure error σ (rms value) is given in Marechal's equation (Equation 2) below where n is the number of multilayer mirrors in the projection optical system, and λ is a wavelength of the reflected EUV light.

$$\sigma = \frac{\lambda}{28 \times \sqrt{n}}. \qquad (2)$$

For example, six multilayer mirrors in the projection optical system that uses the exposure light with a wavelength of 13 nm is permitted to have a figure error a of 0.19 nm. The wave front aberration amount is about 0.4 nm for resolution of 30 nm pattern transfer, which is permitted for the whole projection optical system.

Therefore, a surface precision required for the multilayer mirror in the projection optical system is very high, and the surface precision of 0.2 nm as a phase is necessary.

The conventional fabrication method of the multilayer mirror includes a forming process of the multilayer mirror and a shape measuring process.

The multilayer mirror forming process polishes the substrate while repeating the shape measurement with the interferometer that uses visible light, and forms a predetermined shape substrate. Next, the multilayer film is formed on the substrate surface. When actually functioning as the optical system, a best thickness distribution is formed in consideration of the angle and the wavelength of the light irradiated to each position of the multilayer film on the mirror surface.

The shape measuring process measures the surface shape of the multilayer mirror that completes the forming the multilayer film by the interferometer that uses visible light, and judges whether the surface shape of the multilayer film satisfies the predetermined shape (in other words, above figure error σ). The multilayer mirror judged not to have the predetermined surface shape exfoliates the multilayer because the forming the multilayer film has failed, and re-forms the multilayer film.

The method using a Point Diffraction Interferometer (PDI) that directly measures the reflection surface of the multilayer mirror by using the EUV light is known as other prior arts (see, for example, U.S. Patent Application Publication No. 2002/044287 and Japanese Patent Application Publication No. 2000-97620).

Moreover, the method that acquires the layer structure of the X-ray multilayer mirror and the information of interface roughness from the form of X-ray standing wave spectrum is known (see, for example, Japanese Patent Application Publication No. 2002-243669 and Japanese Patent Application Publication No. 2000-55841).

The data concerning the electronic energy loss in the material has been disclosed (see, for example, Youta Nakai et al., "Stopping power of the material to electron of 10 keV or less", Applied physics volume 51 section 3, page 279, March, 1982). The model calculation concerning the relationship between the reflectivity of the multilayer film and the phase of the reflected light has been disclosed (see, for example, J. H. Underwood and T. W. Barbee, "Layered Synthetic Microstructures as Bragg Diffractors for X-Rays and Extreme Ultraviolet: Theory and Predicted Performance", Applied Optics 20, 3027 (1981)). Moreover, the photoelectric effect of the multilayer film has been disclosed (see, for example, Michael E. Malinowski, Chip Steinhaus, W. Miles Clift, Leonard E. Klebanoff, Stanley Mrowka, Regina Soufli, "Controlling contamination in Mo/Si multilayer mirrors by Si surface capping modifications", Proc. SPIE Vol. 4688, Page 442-453, July 2002).

The conventional method measures the surface shape of the multilayer mirror, can not obtain the wave front of the reflected light if the phase is not considered. Therefore, the wave front of the reflected light can not be correctly obtained, and it is difficult to accurately correct the multilayer film.

The PDI method directly measures the reflection surface of the multilayer mirror, and the manufacturing of the apparatus is difficult because the size of the pinhole used to generate an accurate spherical wave is very minute (for example, plural tens nm). Therefore, it is necessary to use very high-luminance light source to introduce enough amount of the EUV light into the minute pinhole, so the measurement system becomes very large and expensive.

Accordingly, it is an exemplary object of the present invention to provide a fabrication method of an optical element that can easily fabricate an optical element that has a multilayer film with a desired performance.

BRIEF SUMMARY OF THE INVENTION

A fabrication method of an optical element having a multilayer film according to one aspect of the present invention includes the steps of forming a multilayer film on a substrate, measuring a secondary radiation radiated from the multilayer film when a light with a wavelength of 2 to 40 nm is irradiated to the multilayer film, determining a phase difference between the light irradiated to the multilayer film and the light reflected from the multilayer film based on a measurement result of the measuring step, and modifying the multilayer film based on the determined phase difference.

A modification apparatus of an optical element having a multilayer film according to another aspect of the present invention includes a irradiating optical system for irradiating the multilayer film using a light with a wavelength of 2 to 40 nm, a detector for detecting a secondary radiation radiated from the multilayer film by irradiating the light to the multilayer film, a modification part for modifying the multilayer film, and a controller for determining a phase difference between the light irradiated to the multilayer film and the light reflected from the multilayer film based on a detection value of the detector, and controlling the correction part based on the determined value.

An evaluation method of an optical element having a multilayer film according to another aspect of the present invention includes the steps of measuring a secondary radiation radiated from the multilayer film when a light with a wavelength of 2 to 40 nm is irradiated to the optical element, determining a phase difference between the light irradiated to the multilayer film and the light reflected from the multilayer film based on a measurement result, and judging whether to use the optical element based on the determined phase difference.

An exposure apparatus according to another aspect of the present invention includes a projection optical system for projecting a pattern of a reticle onto an object, the projection optical system includes an optical element having a multilayer film fabricated by a fabrication method, wherein the fabrication method includes the steps of forming the multilayer film on a substrate, measuring a secondary radiation radiated from the multilayer film when a light with a wavelength of 2 to 40 nm is irradiated to the multilayer film, determining a phase difference between the light irradiated to the multilayer film and the light reflected from the multilayer film based on a measurement result of the measuring step, and modifying the multilayer film based on the determined phase difference.

A device fabrication method according to another aspect of the present invention includes the steps of exposing an object using an exposure apparatus, and performing a development process for the object exposed, wherein said exposure apparatus includes a projection optical system for projecting a pattern of a reticle onto the object, the projection optical system includes an optical element having a multilayer film fabricated by a fabrication method, wherein the fabrication method includes the steps of forming the multilayer film on a substrate, measuring a secondary radiation radiated from the multilayer film when a light with a wavelength of 2 to 40 nm is irradiated to the multilayer film, determining a phase difference between the light irradiated to the multilayer film and the light reflected from the multilayer film based on a measurement result of the measuring step, and modifying the multilayer film based on the determined phase difference.

Other objects and further features of the present invention will become readily apparent from the following description of the preferred embodiments with reference to the accompanying drawings.

DETAILED DESCRIPTION OF THE PREFERRED EMBODIMENTS

Figure 3:
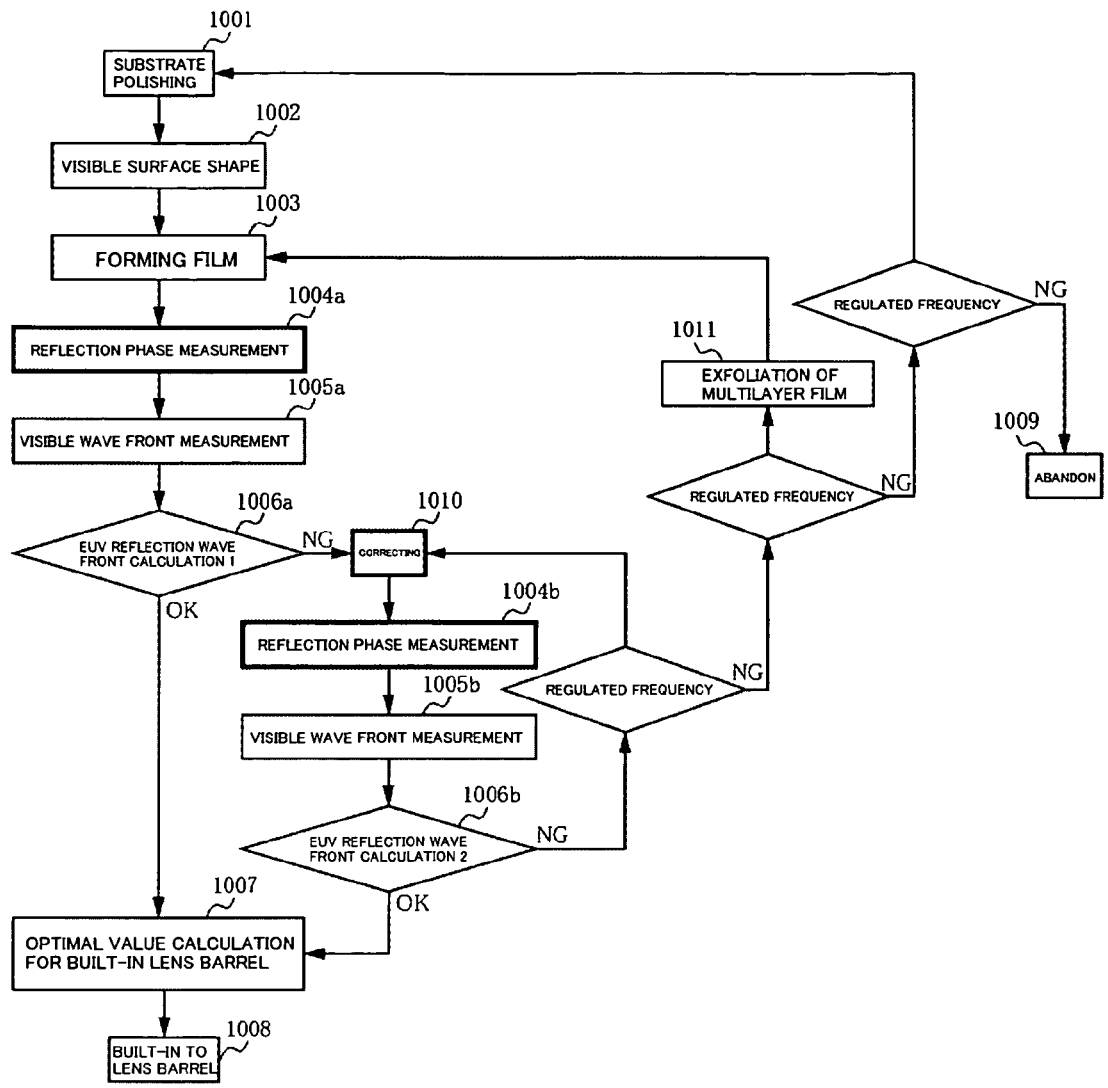
FIG. 3 is a flowchart for explaining a fabrication method of an optical element as one embodiment according to the present invention.

Referring now to FIG. 3, a description will be given of a main part of a fabrication method of an optical element having a multilayer film of the instant embodiment. Here, FIG. 3 is a flowchart of the main part of the fabrication method of the optical element of the instant embodiment.

First, a substrate is polished (step 1001). Next, a surface shape is measured by visible light (step 1002). Next, a multilayer film that has a predetermined film thickness on the substrate of predetermined shape is formed (step 1003).

Next, the surface shape of the multilayer film is measured during a reflection position measurement step (step 1004a) and a visible wave front measurement step (step 1005a). In this case, the conventional shape measuring process measures only a geometrical shape of the multilayer surface. On the other hand, the instant embodiment calculates, as described later, an equivalent shape of the reflection surface based on a phase difference between an incident light and a reflected light in addition to the geometrical shape of the multilayer surface. The phase difference between the incident light and the reflected light is calculated by using the standing wave generated when light with a wavelength of 2 to 40 nm (EUV light) is irradiated to the multilayer film of optical element (for example, multilayer mirror or reflection-type mask) that the multilayer film that has the predetermined film thickness on the substrate of predetermined shape is formed, and a shape of "equivalent reflection surface" described later is calculated by using the phase difference.

Next, the EUV reflection wave front is calculated (step 1006a) to judge whether a design value of the shape of "equivalent reflection surface" or a difference (error) from an ideal shape is within a tolerance (for example, above figure error σ).

In step 1006a, if multilayer film is judged to not be within the tolerance, the multilayer film forming is improper, and the multilayer film (step 1010) is corrected (modified). This correcting method (modifying method) is a method of using a coating milling shown by the following embodiment, a method of adding an addition film, and a method of applying heat etc. The trouble of the multilayer film is corrected by various correcting methods, and it returns to steps 1004b and 1005b. A regulated frequency (for example, three times) repeats this correcting, measuring, and calculating, the multilayer film is exfoliated for NG (step 1011), and a new multilayer film is formed to the substrate. After the multilayer film forms, the multilayer film is measured by the reflection position measurement (step 1004a) and the visible wave front measurement (step 1005a), and it judges that it is within the tolerance.

A regulated frequency (for example, three times) repeats the exfoliating, forming, and measuring steps, and the regulated frequency is repeated for the polishing a substrate recycle for NG. A problem is created when the multilayer film is not within the tolerance. Then, when there is the problem in the substrate, it is judged that the substrate recycle is impossible, and abandons the substrate (step 1009).

On the other hand, in step 1006a, if it is judged that it is within the tolerance, the forming the multilayer film considers suitableness. Then, a necessary amount of correction optimal value is calculated when the optical element is built into a lens barrel (step 1007), and it advances to a built-in to the lens barrel process (step 1008).

The instant embodiment measures the shape of equivalent reflection surface that originates in the phase difference as shown in steps 1004 to 1006, and improves the shape measurement accuracy. Then, the instant embodiment calculates the wave front of the reflected light from the multilayer film, and facilitates the correction of the multilayer film.

A description will be given of the calculation of the shape of "equivalent reflection surface".

The wave front of light is defined as surface where the phase of an electromagnetic field vibration is equal, and is orthogonal for the light beam shown geometrical. The wave front of parallel light is a plane surface that is orthogonal for the traveling direction of light, and such light is called a plane wave.

For a simple example, there is the case where the plane wave of incidence angle 0° reflects from a plane mirror. The wave front is a parallel plane to the mirror surface because of the incidence angle 0°. When a phase difference by reflection on the mirror surface, in other words, the phase difference between the reflected light and the incident light is constant everywhere on the mirror surface, the incident light receives a phase change in a constant amount by the reflection. Therefore, a wave front of the reflected light (=equivalent phase surface) is also parallel plane to the mirror surface.

Next, there is the case where the plane wave reflects from a mirror that is not plane surface. If the phase difference by the reflection on the mirror surface is constant everywhere on the mirror surface, the reflected light receives a constant phase change. However, because an optical path difference is caused by a convexoconcavity of the mirror surface, the wave front of the reflected light (=equivalent phase surface) shifts from the plane surface. When the wave front has risen h at a single position on the mirror surface, the wave front of the reflected light becomes a shape (away from the mirror) that 2 h rises at the position corresponding to it.

When the phase difference generated by the reflection on the mirror surface is partially different than the mirror surface even if a plane mirror, the reflected light receives the phase change that is different according to place. Therefore, a wave front of the reflected light (=equivalent phase surface) becomes a shape that shifts from the plane surface. When the phase difference of the place on the plane mirror by the reflection is δ (rad) larger than the surrounding area, the wave front of the reflected light reflected from the place becomes a shape (away from the mirror) that rises δλ/2π from the mirror surface compared with the wave front that reflected from the surrounding area. Here, λ is the wavelength of the incident light. In this case, the phase difference by the reflection on the surface is constant, and is equivalent to the case for reflecting at a mirror that the mirror surface rises δλ/2π.

Thus, a mirror shape to convert the phase difference by the reflection on the surface into the mirror shape is called "equivalent reflection surface".

Moreover, there is a case that the wave front is reflected by a mirror where the surface is not a plane surface and the phase difference generated by the reflection is not constant in the surface. When the shape at the position of the mirror rises h, in addition, the phase difference of this position by the reflection is δ larger than the surrounding area, it becomes a combination of above 2 examples. Therefore, the shape of the reflected light becomes a shape (away from the mirror) that rises 2 h+δλ/2π. In this case, the equivalently reflection surface becomes a shape that rises (h+δλ/4π).

When the incidence angle θ is not 0°, a similar idea consists if a geometrical optical path difference is corrected, and in general, equivalently reflection surface is corrected to h+δλ/(4π cos θ). The conventional shape measuring process measures only h, but the instant embodiment calculates h+δλ/(4π cos θ), and compares this with the figure error σ. Moreover, the conventional can not accurately measure the phase difference δ, but the instant embodiment can measure the phase difference δ easily and accurately as explained as follows. The instant embodiment explained that the plane wave is incident for the simplification. When the incident light is not the plane wave but a spherical wave or a case of superimposing the aberration, it is possible to approximate to the plane wave if there is a enough small area.

When a monochromatic parallel EUV light is incident to the multilayer film, the EUV light reflected from this multilayer film has the same phase difference as the incident light. The incident light and the reflected light interfere inside and outside of the multilayer film, and the standing wave is generated. The present invention obtains the above phase difference δ by using the standing wave, and accurately measures a relationship between the wave front of the incident light and the wave front of the reflected light. The method in detail is explained as follows.

When the EUV light is incident to the multilayer film and the EUV light reflects from multiplayer film, the phase difference between the incident light and the reflected light changes due to a multilayer film structure, an optical constant of material that composes the multilayer film, an incident angle, and the wavelength of the EUV light, etc. An electric field amplitude of the reflected light is r×$E_0$, where $E_0$ is an electric field strength of the incidence EUV light, and r is an amplitude reflectance of the incidence EUV light. The phase difference δ between the incident light and the reflected light, and an amplitude E of the electric field where the incident light is overlapped with the reflected light is shown by Equation 3.

$$E = E_0(1 + r \times \cos \delta) \quad (3)$$

The electric field strength is proportional to the square of the amplitude, and the reflectivity R of light is the square of the amplitude reflectance r. Thereby, a ratio (electric field strength ratio) of an electric field strength I (of the standing wave generated by interference of the incident light and the reflected light) of the multilayer film and an electric field strength $I_0$ of the incident light is shown by Equation 4.

$$I/I_0 = (1 + R + 2 \times R^{1/2} \times \cos \delta) \quad (4)$$

The ratio $I/I_0$ of the electric field strength of the multilayer film surface and the electric field strength of the incident light and the reflectivity R are calculated from Equation 4, and the phase difference δ can be obtained. The reflectivity R can be easily measured by measuring the light intensity of the incident light and the light intensity of the reflected light and calculating a ratio of both. This result of a measuring method of the ratio $I/I_0$ of the electric field strength of the multilayer film surface and the electric field strength of the incident light is explained in detail as follows.

Figure 4:
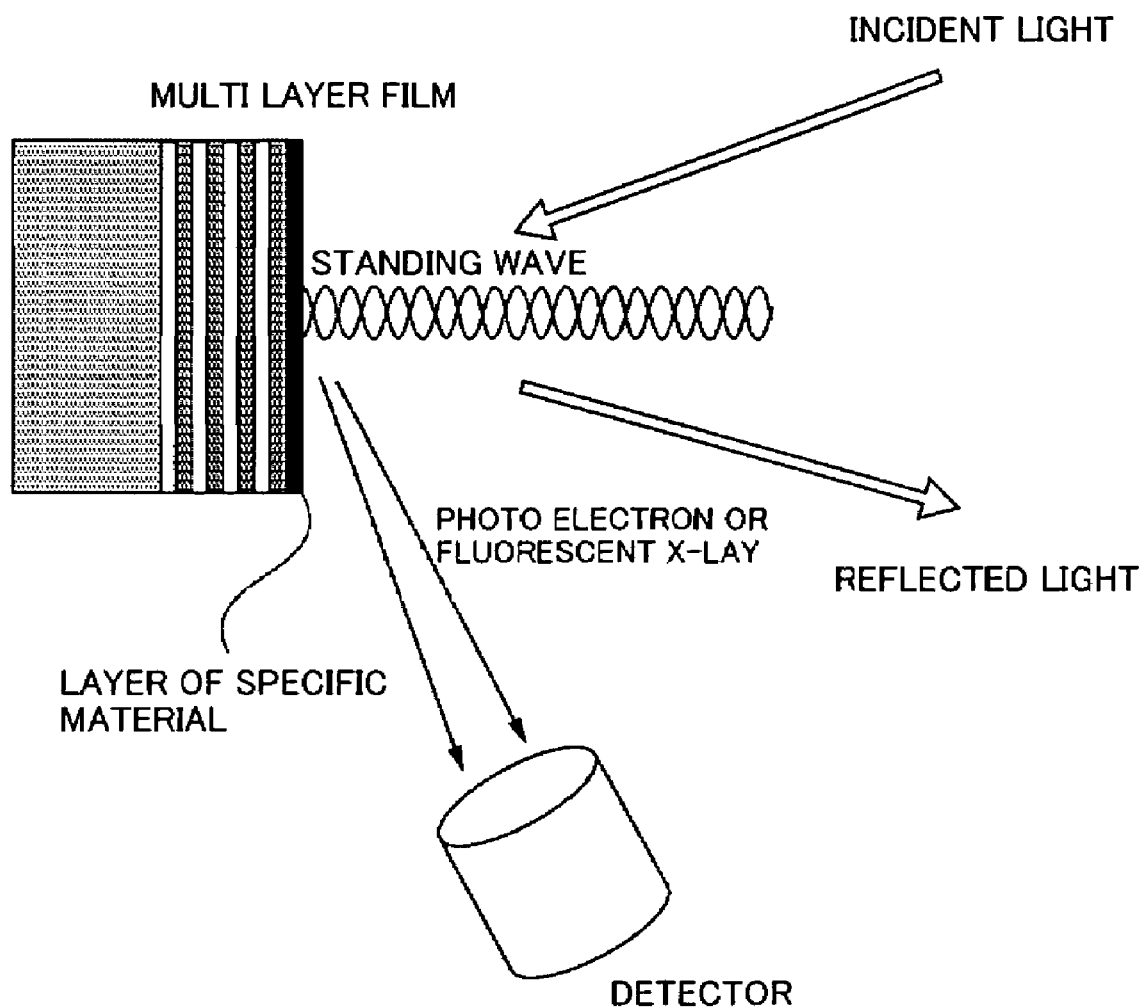
FIG. 4 is a typical view for measuring a field strength ratio of a multilayer film surface used for the instant embodiment.

When the EUV light is irradiated to the material in the vacuum, a part of light is absorbed to the material, and a photoelectric effect is caused, and an electron is discharged. An amount of the discharged photoelectron is proportional to electric field strength at the position. Then, a photoelectric detector such as a microchannel plate and an electron multiplier is installed near an irradiation area of the EUV light on the multilayer film shown in FIG. 4, and the amount of the photoelectron is measured.

When the photoelectric effect occurs on the surface of the material, the discharged electron is discharged with little energy loss in the vacuum. This phenomenon is an external photoelectric effect. On the other hand, when the a photoelectric effect occurs in the material (a position from the surface that is deeper than about 1 nm), the discharged electron inelastically collides with a surrounding atom, loses energy rapidly, and little energy is discharged in the vacuum. The majority of the energy is lost when discharged from the atom even if discharged in the vacuum, and therefore the electron with low energy is discharged. Therefore, the amount of the electron discharged in the vacuum by the external photoelectric effect is proportional to the electric field strength in the nearest surface of the material (an area from the surface that is shallower than about 1 nm). When the EUV light with a incidence angle of $θ_0$ that satisfies the Bragg's condition (law) and a wavelength of λ is incident to the multilayer film composed to obtain the high reflectivity by the predetermined incidence angle of $θ_0$ and the predetermined wavelength of $λ_0$, an amount $Q_R$ of the photoelectron discharged from the surface in the vacuum is proportional to the electric field strength of the standing wave of the nearest surface of the material generated by the interference of the incident light and the reflected light.

When the EUV light is irradiated to the material in the vacuum, a part of light is absorbed to the material, for example, not only the photoelectron but also, for example, fluorescent X-ray as other secondary radiations is discharged. An amount of the discharged fluorescent X-ray is proportional to electric field strength at the position. Then, the amount of fluorescent X-ray is measured by an X-ray detector as the detector shown in FIG. 4, and the amount of fluorescent X-ray may be used as above $Q_R$.

The energy of fluorescent X-ray has a peculiar energy to the atom that discharges it. Therefore, the electric field strength at the position of a specific atom can be measured by being spectrum as for fluorescent X-ray and measuring only the light intensity of X-ray that has the peculiar energy.

Therefore, a thin film composed of an element different from an element that composes the multilayer film is formed on the surface of the multilayer film, and if the light intensity of the peculiar fluorescent X-ray reflected from this element is measured, the electric field strength of the near surface of the multilayer film can be measured.

When the EUV light with a greatly different incidence angle from the incidence angle $θ_0$ and a wavelength of $λ_0$ is incident to this multilayer film, the reflectivity remarkably decreases because it deviates from the condition of strengthening the light intensity of reflected light, and the light intensity of the reflected light becomes remarkably small compared with the light intensity of the incident light. At this time, an amount $Q_0$ of the photoelectron discharged from the multilayer film surface in the vacuum is almost proportional to the electric field strength of the incident light. At this time, when the incidence angle is near 90 degrees, the reflectivity rises by total reflection's occurring. Then, the incidence angle may be not near 90 degrees.

Figure 6:
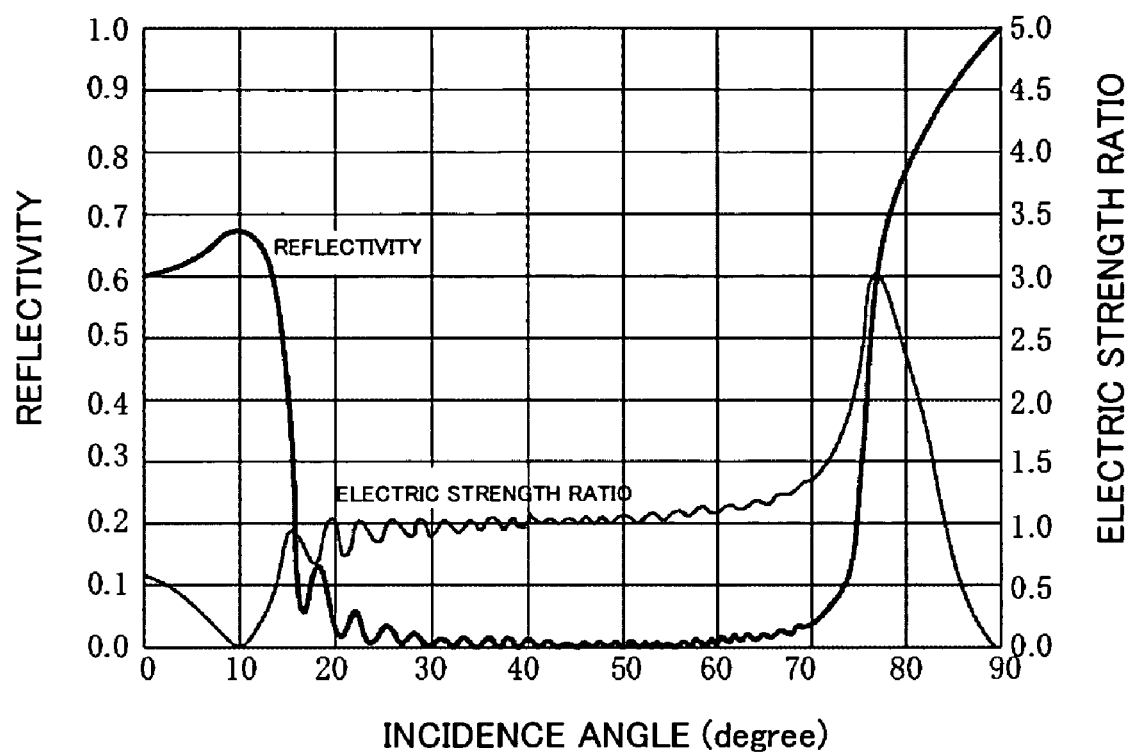
FIG. 6 is a graph of an incidence angle dependency of a reflectivity and an electric field strength ratio.

FIG. 6 is a graph of an example of the incidence angle dependency of the reflectivity and the electric field strength ratio. The electric field strength ratio is a ratio between the electric field strength of the multilayer film surface and the electric field strength of the incident light. This example is wavelength 13.5 nm. A multilayer film that optimized so that the reflectivity may become a peak in the incidence angle 10° is used. In this example, the reflectivity is, in range of about 20 degrees to 70 degrees of the incidence angle, 1/10 or less of the peak reflectivity (about 70%) in the incidence angle 10°, and standardized electric field strength is a value close to 1. In other words, in range of about 20 degrees to 70 degrees of the incidence angle, the electric field strength on the multilayer film surface is almost equal to the electric field strength of the incident light. The amount $Q_0$ of the photoelectron discharged from the multilayer film surface in the vacuum at this time is almost proportional to the electric field strength of the incident light in such a range of the angle degrees. The amount $Q_0$ of the photoelectron discharged from the surface of the multilayer film, at an angle greatly different from the incidence angle where the reflectivity is maximum value, and to which the reflectivity decreases in the vacuum is almost proportional to electric field strength of the incident light for the multilayer film that the reflectivity becomes a peak in an incidence angle different from the example of the instant embodiment.

Then, the EUV light is irradiated on the multilayer film by two angle conditions with first condition that the incidence angle to obtain high reflectivity by satisying Bragg's condition and second condition that the incidence angle to which the reflectivity remarkably decreases compared with the first condition without satisfying Bragg's condition, and the amounts $Q_R$ and $Q_0$ of the photoelectron discharged in the vacuum are obtained. Thereby, a ratio of the electric field strength I of the multilayer film (standing wave) and the electric field strength $I_0$ of the incident light can be obtained by the following Equation 5.

$$Q_R/Q_0 = I/I_0 \qquad (5)$$

When there is a possibility that the light intensity of the incident light changes between two measurement conditions with different incidence angle, a detector that measures the light intensity of the incident light is installed, the amount of the electron discharged in the vacuum is standardized by the light intensity of incident light, an error because of the change of the light intensity of the incident light can be suppressed. When the EUV light with the incidence angle of θ that satisfies the Bragg's condition (law) and the wavelength of λ is irradiated to the multilayer film composed to obtain the high reflectivity by the predetermined incidence angle of $θ_0$ and the predetermined wavelength of $λ_0$, the amount of the photoelectron discharged from the surface in the vacuum is measured by the measuring apparatus shown in FIG. 1. At this time, a light intensity measured by a light intensity monitor 14 is assumed to be $I_{OR}$.

When the EUV light with a greatly different incidence angle from the incidence angle $θ_0$ and a wavelength of $λ_0$ is incident to this multilayer film, the reflectivity remarkably decreases because it deviates from the condition of strengthening the light intensity of reflected light, and the light intensity of the reflected light becomes remarkably small compared with the light intensity of the incident light. At this time, when the amount $Q_0$ of the photoelectron discharged from the multilayer film surface in the vacuum is measured, the beam strength measured by the light intensity monitor 14 is assumed to be $I_{00}$. The error because of the change of the light intensity of the incident light can be suppressed by standardizing the amount of the photoelectron discharged in the vacuum by the light intensity of the incident light (see, Equation 6).

$$(Q_R \times I_{00})/(Q_0 \times I_{OR}) = I/I_0 \qquad (6)$$

When the EUV light with a wavelength of λ that shifts from the wavelength of $λ_0$ in which Bragg's condition is satisfied and the incidence angle $θ_0$ is irradiated to the multilayer film that satisfies Bragg's condition, the reflectivity remarkably decreases because it deviates from the condition of strengthening the light intensity of reflected light, and the light intensity of the reflected light becomes remarkably small compared with the light intensity of the incident light. For example, in FIG. 8, the reflectivity is 1/10 or less, and a very small value compared with the peak reflectivity in a wavelength band that deviates from wavelength of 12.8 to 14 nm.

At this time, an amount $Q_L$ of the photoelectron discharged from the multilayer film surface in the vacuum is almost proportional to the electric field strength of the incident light. However, if wavelength used is greatly differs from the wavelength of $λ_0$ in which Bragg's condition is satisfied, a discharge efficiency of the photoelectron (discharged photoelectric number by incidence photon unit) shifts, and a wavelength close to $λ_0$ is used. Concretely, the discharge efficiency of the photoelectron changes rapidly on the boundary of the absorption edge wavelength of the element that composes the multilayer film surface, and the wavelength may be changed within the range where the absorption edge wavelength of the element that composes the multilayer film surface is not exceeded.

The EUV light is irradiated to the multilayer film while changing the wavelength, and amounts $Q_R$ and $Q_L$ of the photoelectron discharged in the vacuum in two wavelengths with first wavelength to obtain high reflectivity and second wavelength to which reflectivity remarkably decreases compared with it are obtained. Then, a ratio of the electric field strength I of the multilayer film surface and the electric field strength $I_0$ of the incident light can be obtained from Equation 7.

$$Q_R/Q_L = I/I_0 \qquad (7)$$

As similar to the case measured at the different angle, when there is a possibility that the light intensity of the incident light changes between two measurement conditions with different wavelength, a detector that measures the light intensity of the incident light is installed, the amount of the photoelectron discharged in the vacuum is standardized by the light intensity of incident light, an error because of the change of the light intensity of the incident light can be suppressed.

When the EUV light is incident to a single layer film that is composed of a same material that composes the multilayer film surface, the reflectivity becomes extremely small, and the light intensity of the reflected light becomes very small compared with the light intensity of the incident light. At this time, an amount $Q_{00}$ of the photoelectron discharged from the single layer film surface in the vacuum is almost proportional to the electric field strength of the incident light.

Therefore, an amount $Q_R$ of photoelectron discharged in vacuum when the EUV light with the incidence angle to obtain high reflectivity is irradiated to the multilayer film and an amount $Q_{00}$ of photoelectron discharged in vacuum when the EUV light is irradiated to the single layer film that is composed of the same material that composes the multilayer film surface can be obtained, and a ratio of the electric field strength I of the multilayer film surface and the electric field strength $I_0$ of the incident light can be obtained from Equation 8.

$$Q_R/Q_{00} = I/I_0 \qquad (8)$$

In a similar case, when there is a possibility that the light intensity of the incident light changes between two measurement conditions, a detector that measures the light intensity of the incident light is installed, the amount of the photoelectron discharged in the vacuum is standardized by the light intensity of incident light, an error because of the change of the light intensity of the incident light can be suppressed.

Next, a phase δ is calculated by the following Equation 9.

$$\cos\delta = (I/I_0 - 1 - R)/(2 \times R^{1/2}) \quad (9)$$

When the phase difference is obtained from the cosine of the phase difference, there is an uncertainty of integral multiples of $2\pi$ in the phase difference, but the phase difference may be continuous in the continuously measured area or for the wavelength change. There is an uncertainty of the positive-negative of the phase difference, but it may have a positive inclination in the near reflection peak of the multilayer film.

The phase difference δ between the phase of the incident light and the phase of the reflected light can be obtained by measuring the ratio $I/I_0$ of the electric field strength of the multilayer film surface and the electric field strength of the incident light by using the above method. Next, a description will be given of a method of obtaining the wave front of the EUV light reflected by the multilayer film.

The surface shape of the multilayer film (in other words, above h) can be measure with high accuracy by an already-known method in art, for example, a method that mechanically directly measures the shape by touching the stylus to the surface, and a method using an interferometer that uses the visible light and ultraviolet light, etc.

When the phase difference δ between the incident light and the reflected light by reflection on the mirror surface is constant in the mirror surface and does not depend on the incidence angle, the wave front of the EUV light reflected by the multilayer film can be obtained by using an usually ray tracing method and diffraction integration method, etc. (see, for example, Kunio Tsuruta, Applied optics I, (July, 1990 issue)).

When the phase difference δ between the incident light and the reflected light by reflection on the mirror surface is changed in the mirror surface and depends on the incidence angle, the wave front of the EUV light reflected by the multilayer film can be obtained from the multilayer film shape by adding the optical path length of only $\delta\lambda/2\pi$ on the multilayer film surface and using the diffraction integration method, etc.

Figure 7:
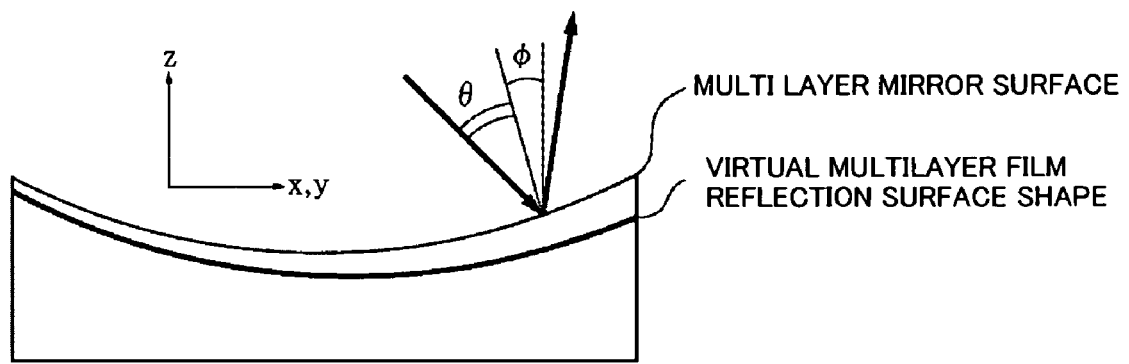
FIG. 7 is a schematic sectional view for explaining a measuring method of a reflection surface shape of a multilayer mirror.

The equivalently surface shape is shown by Equation 10, where a coordinate on the mirror surface is x and y, a geometrical surface shape of the multilayer mirror is h (x, y), an inclination of a mirror normal to XY plane is φ (x, y), an incidence angle distribution of the EUV light to the mirror surface is θ (x, y), and the phase difference between the incident light and the reflected light as the EUV light is δ (x, y, λ, θ). The wave front of the reflected light or the light beam is obtained by the ray tracing method by using this equivalently surface shape. Here, FIG. 7 is a schematic sectional view for explaining a measuring method of the reflection surface shape of the multilayer mirror.

$$Z(x, y, \theta) = h(x, y) + \frac{\lambda\delta(x, y, \lambda, \theta)}{4\pi\cos\theta(x, y)\cos\phi(x, y)} \quad (10)$$

Thus, the instant embodiment obtains the phase difference δ between the incident light and the reflected light by measuring the secondary radiation discharged by the standing wave caused when the EUV light is incident to the multilayer film, and obtains $h+\delta\lambda/(4\pi \cos\theta)$ as the equivalently surface shape to the EUV light or the wave front of the EUV light reflected by the multilayer film from the measurement result of the geometrical surface shape of the multilayer surface (in other words, h) and the phase difference δ. The conventional shape measuring process obtains h, but the shape measuring process of the instant embodiment obtains $h+\delta\lambda/(4\pi \cos\theta)$, and the accuracy of the shape measuring process improves to the EUV light process. As a result, the instant embodiment can accurately execute the correction of the multilayer film. Moreover, the instant embodiment can easily obtain the phase difference between the incident light and the reflected light by the measuring apparatus by the addition of the photoelectron or fluorescent X-ray detector to a reflectivity measuring apparatus, and can be measured with high accuracy using a very small apparatus compared with the conventional interference measuring method such as PDI etc.

A description will be given of a more concretely embodiment.

First Embodiment

A description will be given of a more concrete method for obtaining "equivalent reflection surface" in the first embodiment.

Figure 1:
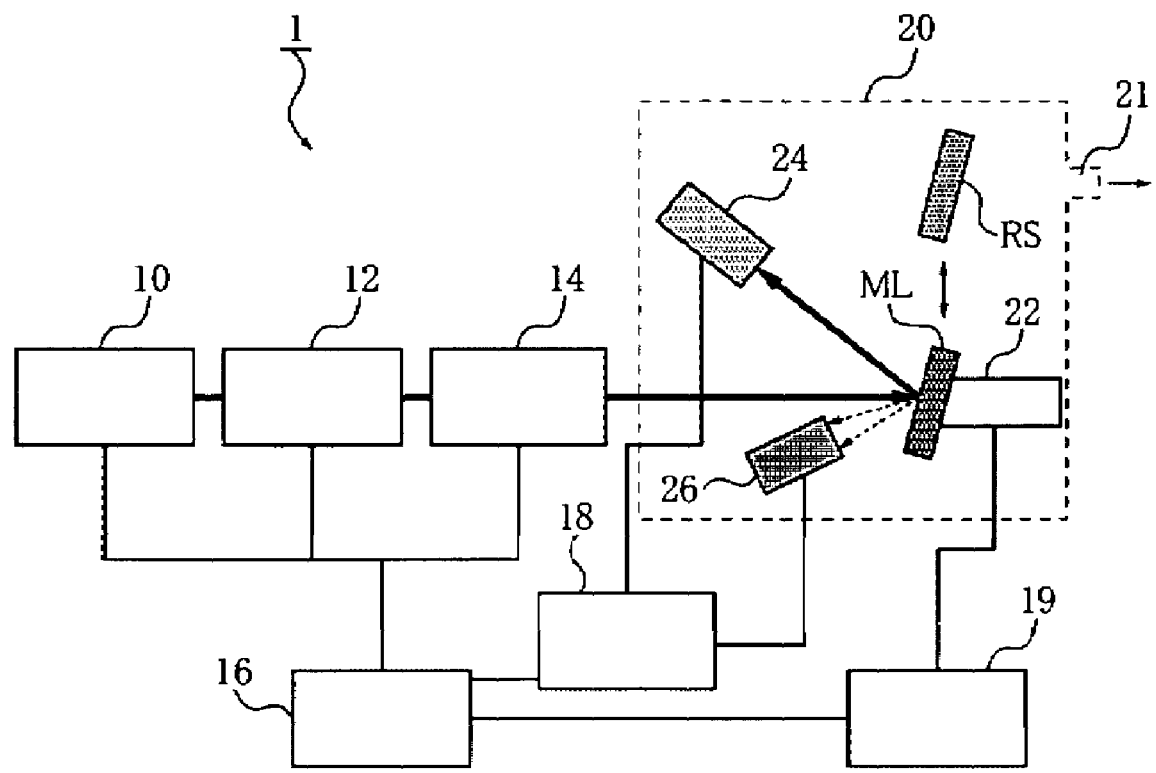
FIG. 1 is a block diagram of an equivalently shape change by a phase difference and a phase change between an incident light and reflected light of a multilayer mirror as one embodiment according to the present invention.

FIG. 1 is a schematic block diagram of a measuring apparatus 1 of the first embodiment. The EUV light radiated from a EUV light source 10 as a synchrotron radiation light source, laser plasma light source, and discharge plasma light source etc. is separated only to predetermined wavelength by a spectroscope 12, and is made monochrome. The EUV light made monochrome is led to a multilayer mirror (or sample) ML as a measurement target or a measuring room 20 that houses a detector 24 and 26. The spectroscope 12 and the light intensity monitor 14 compose an irradiation system. The measuring room 20 has been exhausted to the ultra-high vacuum by an exhaust part 21 such as a vacuum pump etc. to prevent an attenuation of the EUV light and diffusion of the photoelectron, or a pollution adhering to the multilayer film surface. The multilayer mirror ML as the measurement target is fixed on a stage 22 that can be rotated and moved in a direction of translation, and the EUV light made monochrome is incident to a predetermined position of the multilayer mirror ML at a predetermined angle. The EUV light reflected by the multilayer mirror ML is led to a EUV light detector 24, and a light intensity of the reflected light is measured. The detector 24 uses a photodiode, photoelectron multiplier, and CCD, etc. The multilayer mirror ML can be removed by the stage 22, and light intensity of the incident light is measured by directly irradiating the EUV light made monochrome to the detector 24. The output of the detector 24 is converted into a voltage signal by a charge sensitive amplifier, the voltage signal is converted into a digital signal by using an analog-digital converter (ADC) 18, and the digital signal is taken into an operation part 16 such as computers. The operation part (controller) 16 can obtains the reflectivity R by calculating the ratio of the light intensity of the reflected light reflected by the multilayer mirror ML and the light intensity of the incident light.

The incident light intensity monitor 14, that measures the light intensity of the monochrome EUV light led to the measuring room 20, has been installed to correct a time change of the light intensity radiated from the light source 10. When the synchrotron radiation light source is used, it may be assumed the incident light monitor by measuring the current of an electron accumulation ring of the light source.

A detector 26 that detects the photoelectron is installed near the multilayer mirror. The detector uses an electron multiplier, and micro channel plate (MCP), etc. An incident electrode of the detector 26 is set to become positive potential for multilayer mirror ML so that the discharged photoelectron is taken easily. When the photoelectron discharged from the surface of the multilayer mirror ML is incident to the electron multiplier or the MCP, the photoelectron receives the electron doubling function by a high voltage that is applied inside, and the photoelectron is output as an amplified electric charge signal. This is converted into the voltage signal using the charge sensitive amplifier, the voltage signal is converted into the digital signal by using the analog-digital converter (ADC) 18, and the digital signal is taken into the operation part 16.

The instant embodiment measures the phase of the reflected light according to the following process.

First, the multilayer sample (multilayer mirror) ML is removed by the stage 22, and the light intensity of the incident light is measured by the detector 24. At this time, wavelength is scanned while changing the wavelength $\lambda$ of the EUV light that exits from the spectroscope 12, and the wavelength dependency of the light intensity of the incident light is measured. The light intensity of the incident light is $I_{R0}(\lambda)$, and an output of the incident light intensity monitor at the measurement is $I_{00}(\lambda)$.

Next, the EUV light made monochrome is set to be incident to the predetermined position of the multilayer film mirror at the predetermined angle by the stage 22, and the light intensity of the reflected light is measured by the detector. The amount of the photoelectron discharged from the sample surface is measured by the detector 26 at the same time. At this time, wavelength is scanned while changing the wavelength setting of the spectroscope 12, and the wavelength dependency of the light intensity of the reflected light and the wavelength dependency of the amount of the photoelectron discharged from surface of the sample ML are measured at the same time. The light intensity reflected by the multilayer sample is $I_{R1}(\lambda)$, the measured discharged amount of the photoelectron of multilayer film is $Q_S(\lambda)$, and the output of the incident light intensity monitor at the measurement is $I_{01}(\lambda)$.

Next, a discharged amount of a photoelectron of a single-layer mirror composed of the material that composes the top layer of the multilayer film as reference sample RS is measured. A thickness of the single layer film of reference sample (or single-layer mirror) RS is more thick than an escape depth of the photoelectron, and the transmittance of the measured light is very small. If the wavelength of light is about 13.5 nm, Mo, Si, and ruthenium (Ru), etc. have a thickness of plural hundreds nm or more. When the top layer of the multilayer film is Si, the Si wafer may be used.

A wavelength dependency of the amount of the photoelectron discharged from the sample surface is measured for the reference sample RS by the method similar to the multilayer film sample ML. The electric field on the sample surface is obtained by adding the electric field of the incident light and the electric field of the reflected light. However, because the reflectivity of the single-layer mirror RS is very small compared with the EUV light, the electric field strength of the single layer film surface is almost equal to the electric field strength of the incident light. At this time, the wavelength dependency of the measured discharged amount of the photoelectron of the reference sample is $Q_R(\lambda)$, and the output of the incident light intensity monitor at the measurement is $I_{02}(\lambda)$.

The wavelength dependency $R(\lambda)$ of the reflectivity of the multilayer mirror ML is shown by Equation 11.

$$R(\lambda)=(I_{R1}(\lambda)\times I_{00}(\lambda))/(I_{R0}(\lambda)\times I_{01}(\lambda)) \qquad (11)$$

The wavelength dependency $F(\lambda)$ of the ratio of the discharged amount of the photoelectron of the multilayer mirror ML and the discharged amount of the photoelectron of the reference sample RS is shown by Equation 12.

$$F(\lambda)=(Q_S(\lambda)\times I_{02}(\lambda))/(Q_R(\lambda)\times I_{01}(\lambda)) \qquad (12)$$

Figure 8:
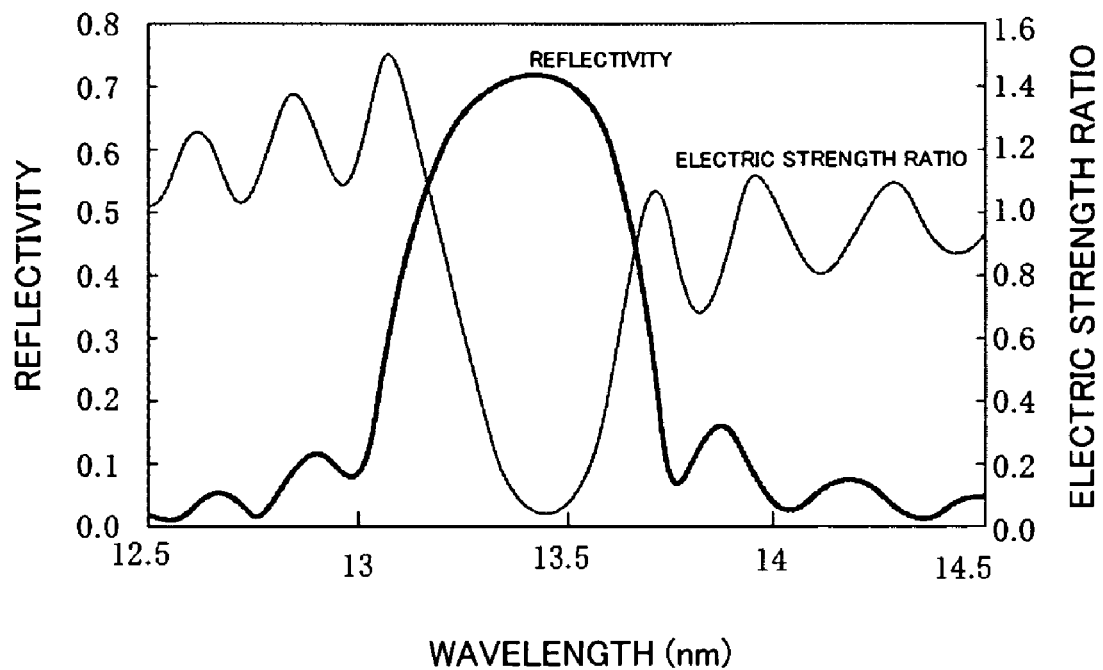
FIG. 8 is a graph of a measurement result of a wavelength dependency of a reflectivity and an electric field strength ratio obtained by the first embodiment.

$F(\lambda)$ is a parameter that shows how many times the discharged amount of the photoelectron of the multilayer mirror ML compared with the single-layer mirror RS. The electric field strength of the single-layer film surface is almost equal to the electric field strength of the incident light, and the ratio $F(\lambda)$ of the discharged amount of the photoelectron of the multilayer mirror and the discharged amount of the photoelectron of the reference sample is equal to an amount (electric field strength ratio) in which whether how many times the electric filed strength of the multilayer film surface compared with the electric field strength of the incident light are shown. FIG. 8 shows the measurement result of the wavelength dependency of the reflectivity and the electric field strength ratio.

Commutatively, the EUV light is irradiated to the multilayer film while changing the wavelength, and amounts $Q_R$ and $Q_L$ of the photoelectron discharged in the vacuum in two wavelengths with the first wavelength (of 13.5 nm in the instant embodiment) to obtain high reflectivity and second wavelength (of 12.5 or 14.5 nm in the instant embodiment) in which reflectivity remarkably decreases compared with it are obtained. A parameter that shows how many times the discharged amount of the photoelectron of the multilayer mirror sample compared with the single-layer mirror is obtained by Equation 13, and this parameter may be considered the electric field strength ratio.

$$F=Q_R/Q_L=I/I_0 \qquad (13)$$

Next, the phase $\delta$ is calculated by the following Equation 14.

$$\cos\delta=(F(\lambda)-1-R(\lambda))/(2\times R(\lambda)^{1/2}) \qquad (14)$$

Figure 9:
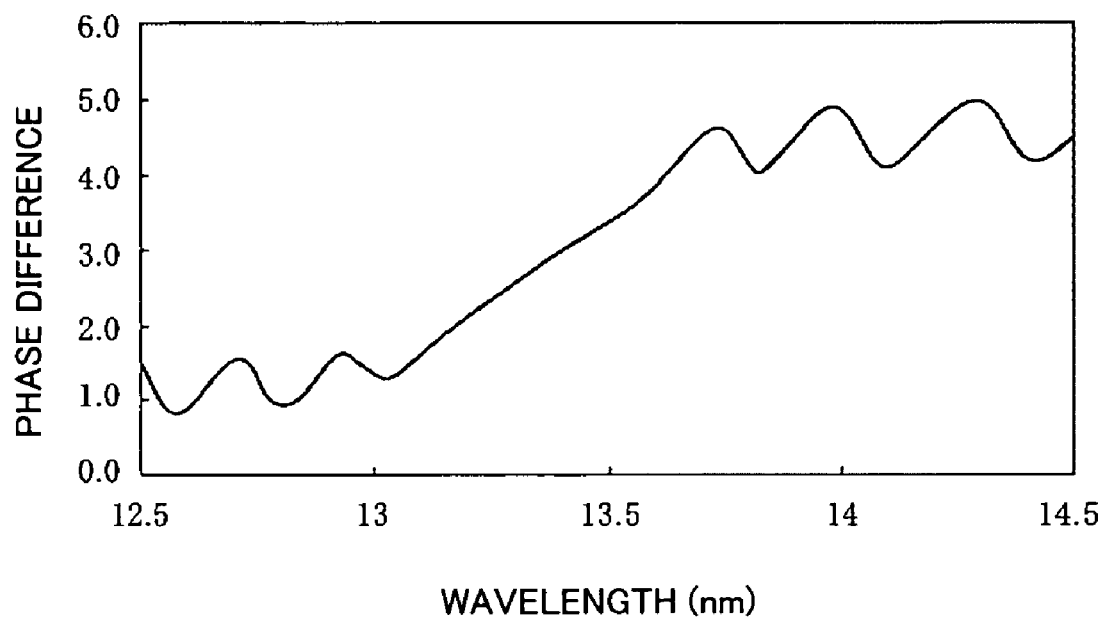
FIG. 9 is a graph of a wavelength dependency of a phase difference between an incident light and reflected light obtained by the first embodiment.

When the phase difference $\delta$ is obtained from the cosine of the phase difference $\delta$, there is an uncertainty of integral multiples of $2\pi$ in the phase difference $\delta$, but the phase difference $\delta$ may be constant in the continuously measured area for the wavelength change. There is an uncertainty of the positive-negative of the phase difference $\delta$, but it may have a positive inclination in the wavelength band of near reflection peak of the multilayer film. FIG. 9 shows the wavelength dependency of the phase difference $\delta$ between the incident light and the reflected light obtained thus.

The surface shape of the multilayer film sample is measured by a Fizeau interferometer and Mirror interferometer, etc. that use visible light or ultraviolet light. The surface shape measurement and the phase measurement by the standing wave are acceptable ahead either, and may be simultaneous.

Next, the shape of equivalent reflection surface for the EUV light (in other words, $\delta\lambda/(4\pi\cos\theta)$ and $h+\delta\lambda/(4\pi\cos\theta)$) is calculated.

Figure 10:
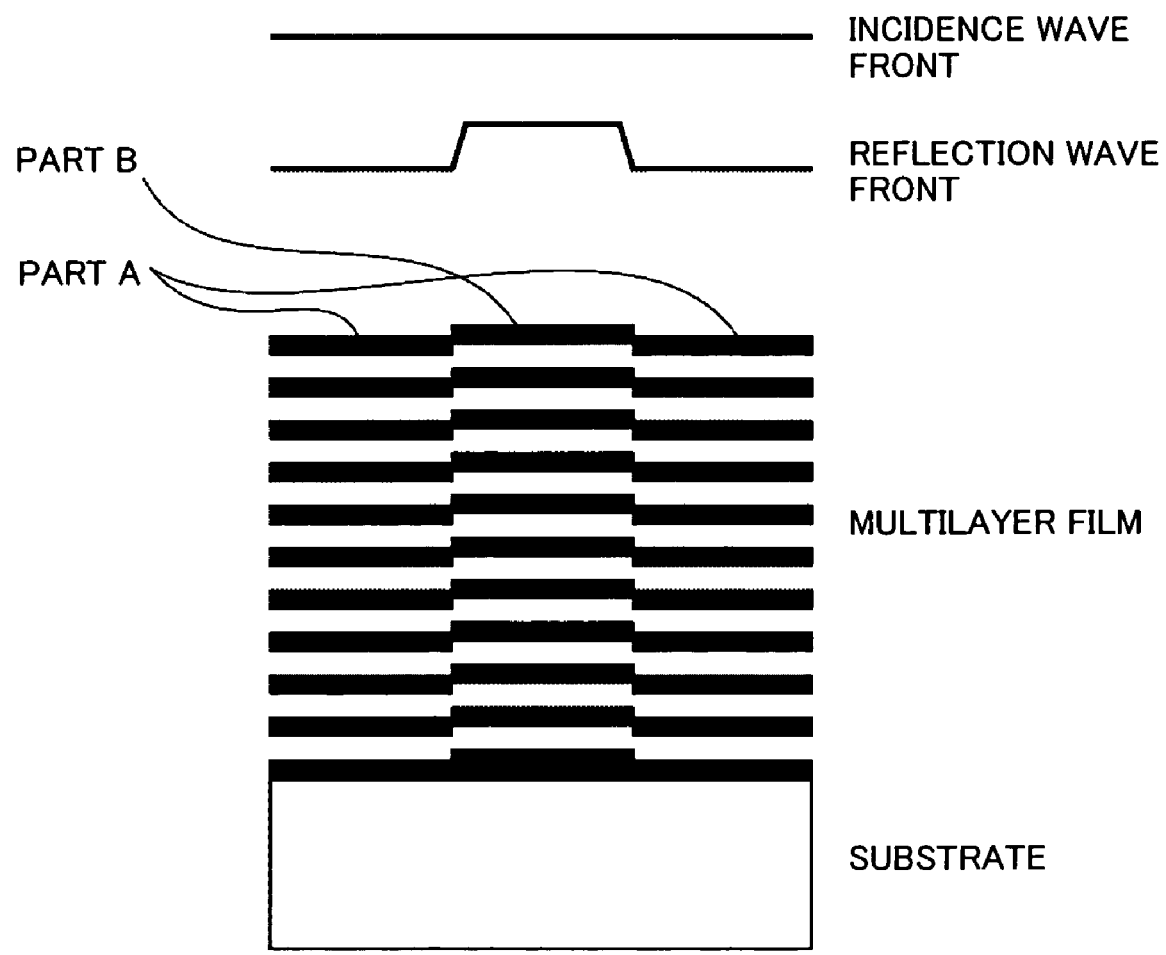
FIG. 10 is a schematic sectional view of one example of a multilayer structure used for the first embodiment.

FIG. 10 shows one example of the multilayer film structure. This example causes a difference in the lowest layer of the multilayer film, and a part B is higher than a part A. The coating cycle is 6 nm, the wavelength of the incidence EUV light is 12 nm, the incidence angle is 0°, and the difference of the part B is 1.5 nm. When the shape is measured by the interferometer that uses visible light, the part B is measured high of 1.5 nm compared with the part A. The phase difference between the part A and the part B is not measured by the above phase measurement that uses the standing wave. Therefore, the part B is 1.5 nm higher than the part A in the shape of equivalently reflection surface for the EUV light. Thereby, when the plane wave is incident to this multilayer film, the part B becomes a shape advanced only by 3 nm (about ¼ wavelength) compared with the part A in the wave front of the reflected light.

Figure 11:
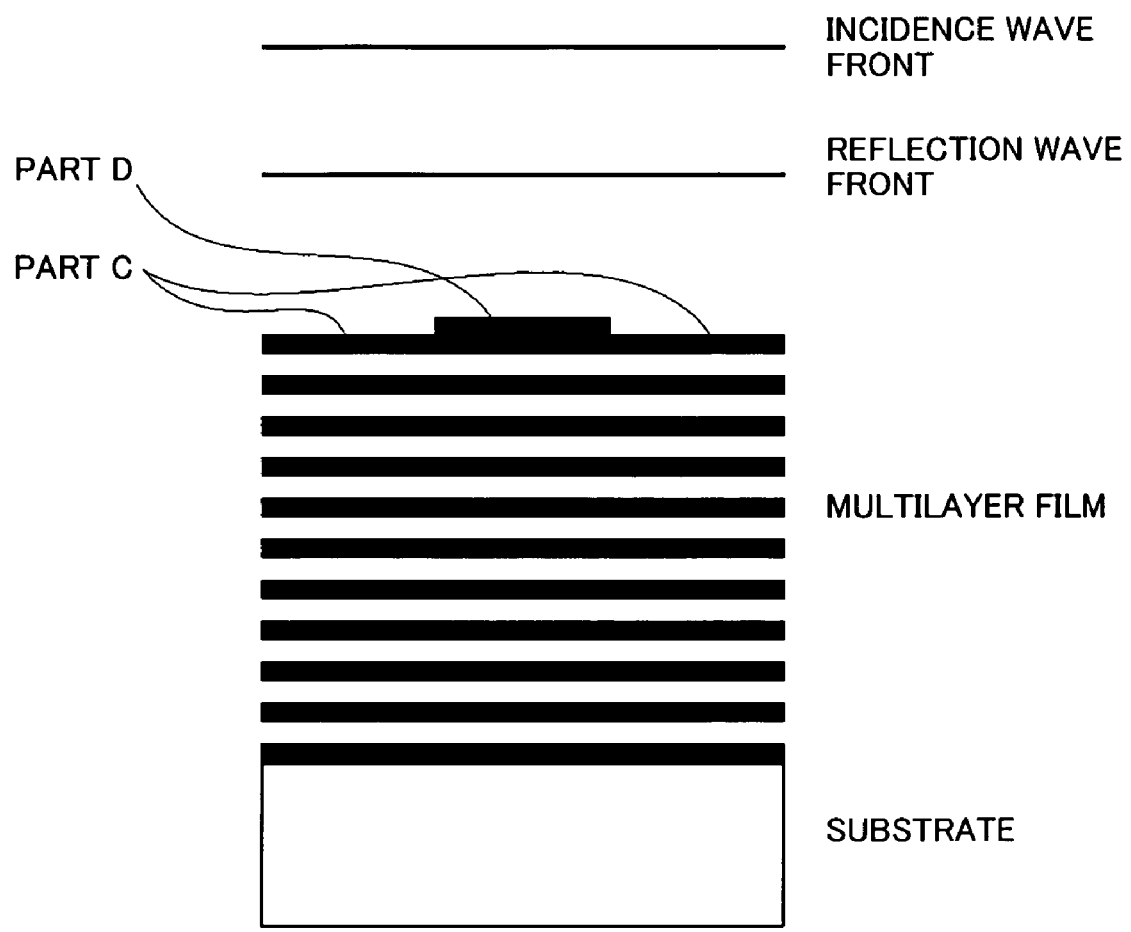
FIG. 11 is a schematic sectional view of another example of a multilayer structure used for the first embodiment.

FIG. 11 shows another example of the multilayer film structure. This example causes a difference in the top layer of the multilayer film, and a part D is higher than a part C. The coating cycle is 6 nm, the wavelength of the incidence EUV light is 12 nm, the incidence angle is 0°, and the difference of the part D is 1.5 nm. When the shape is measured by the interferometer that uses visible light, the part D is measured high of 1.5 nm compared with the part C. The phase difference between the part C and the part D is $\pi/2$ by the above phase measurement that uses the standing wave. Therefore, the shape of equivalent reflection surface for the EUV light is denied by the surface shape and the reflection phase difference each other, and becomes plane surface. In other words, when the plane wave is incident to the multilayer film, the wave front of the reflected light becomes plane surface.

Second Embodiment

A description will be given of other more concretely method for obtaining "equivalent reflection surface" in the second embodiment.

The instant embodiment uses a similar measuring apparatus 1 shown in the first embodiment. The instant embodiment measures the phase of the reflected light according to the following process. First, the multilayer mirror ML is removed by the stage 22, and the light intensity of the incident light is measured by the detector 24. At this time, wavelength is scanned while changing the wavelength $\lambda$ of the EUV light that exits from the spectroscope 12, and the wavelength dependency of the light intensity of the incident light is measured. The light intensity of the incident light is $I_{R0}(\lambda)$, and an output of the incident light intensity monitor at the measurement is $I_{00}(\lambda)$. Next, the EUV light made monochrome is set to be incident to the predetermined position of the multilayer mirror at the predetermined angle, and the light intensity of the reflected light is measured by the detector. The amount of the photoelectron discharged from the surface of the sample (multilayer mirror) ML is measured by the detector 26 at the same time. At this time, wavelength is scanned while changing the wavelength setting of the spectroscope 12, and the wavelength dependency of the light intensity of the reflected light and the wavelength dependency of the amount of the photoelectron discharged from the surface of the sample ML are measured at the same time. The light intensity reflected by the multilayer sample is $I_{R1}(\lambda)$, the measured discharged amount of the photoelectron of multilayer film is $Q_S(\lambda)$, and the output of the incident light intensity monitor at the measurement is $I_{01}(\lambda)$. As above-mentioned, the wavelength dependency $R(\lambda)$ of the reflectivity of the multilayer mirror ML is shown by Equation 11.

On the other hand, the wavelength dependency $G(\lambda)$ of the discharged amount of the photoelectron of the multilayer mirror ML is shown by Equation 14.

$$G(\lambda)=Q_S(\lambda)/(I_{01}(\lambda)\times\lambda) \quad (14)$$

Figure 12:
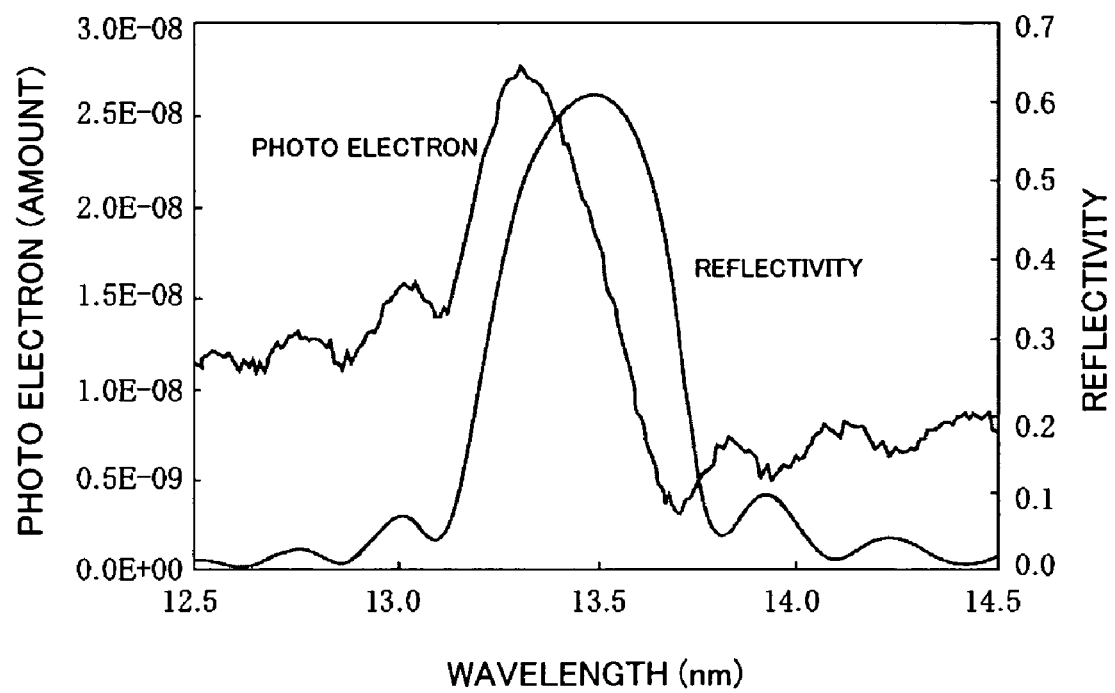
FIG. 12 is a graph of a measurement result of a wavelength dependency of a reflectivity and a photoelectron discharge amount used for the second embodiment.

This is a parameter that shows a ratio between the discharged amount of the photoelectron of the multilayer mirror and a photon number of the incident light. The discharged amount of the photoelectron of one photon is almost constant in the wavelength bands other than in the neighborhood of the wavelength of absorption edge of the material that composes the top layer of the multilayer film. Therefore, $G(\lambda)$ is an amount (electric field strength ratio) in which whether how many times the electric field strength of the multilayer film surface compared with the electric field strength of the incident light are shown. FIG. 12 shows an example of the measurement result of the wavelength dependency of the reflectivity and the discharged amount G of the photoelectron.

Next, the phase $\delta(\lambda)$ is calculated by the model calculation of the multilayer film. The reflectivity of the multilayer film and the phase of the reflected light can be obtained by the model calculation. For example, the model calculation is disclosed in "Controlling contamination in Mo/Si multilayer mirrors by Si surface capping modifications".

Fresnel equations are applied to the each interface of the multilayer film, and a relationship of the complex amplitude of each electric field (incidence wave, transmitted wave, and reflection wave) before and behind the interface is requested for each interface. The recurrence formula is led from this relationship, and a relationship of the complex amplitude of the electric field of the incidence wave and reflection wave of the multilayer film (in other words, complex reflectivity) is finally calculated from start to the substrate side of the multilayer film. The phase is obtained from the imaginary part of the complex reflectivity.

Figure 13:
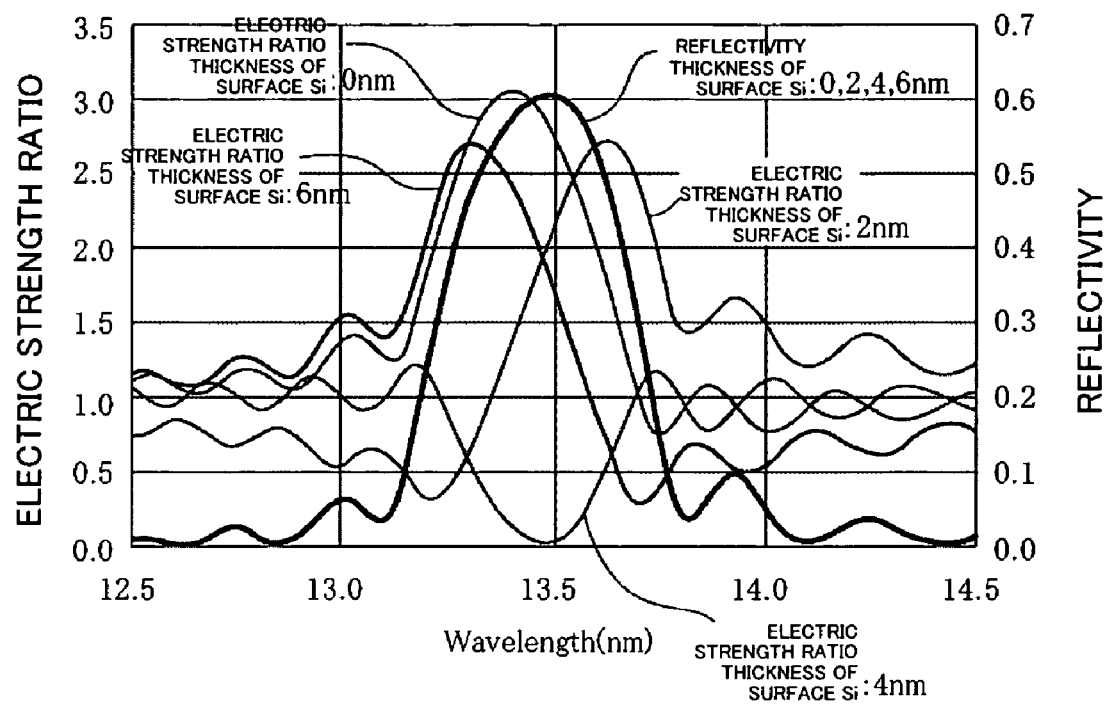
FIG. 13 is a graph of a relationship among a film thickness, wavelength, electric field strength, and reflectivity by model calculation used for the second embodiment.

The electric field strength of the standing wave of the surface is obtained from the result. The thickness of the silicon of the top layer of the multilayer film composed the molybdenum and silicon is assumed to be a parameter in the calculated model. FIG. 13 shows the example of the calculation result. The reflectivity and the electric field strength ratio of the surface respectively when the thickness of the silicon of the top layer of the multilayer film composed the molybdenum and silicon is 0, 2, 4, and 6 nm are plotted. The reflectivity hardly changes even if the thickness of the silicon of the top layer changes. On the other hand, the electric field strength ratio of the surface changes remarkably in proportion to the thickness of the silicon of the top layer.

First, the fitting changes the coating cycle (sum of the thickness of molybdenum and silicon) of the multilayer film composed the molybdenum and silicon of the calculation model, the best coating cycle is obtained so that the measurement value of the reflectivity must correspond to the calculation value.

Next, the thickness of the silicon of the top layer of the calculation model is changed, and the best thickness of the silicon is obtained so that the electric field strength ratio must correspond to the measurement value. At this time, because an absolute value of the electric field strength ratio has the uncertainty, the wavelength dependency of electric field strength ratio corresponds. In other words, the constant and the thickness of the silicon of the top layer are decided so that the product of the measured electric field strength ratio and the constant corresponds to the calculation value. For example, the square sum of the difference between the product of the measured electric field strength ratio and the constant and the electric field strength ratio obtained by the model calculation is assumed to be an evaluation function, the parameter is changed and fitting so that the value of this evaluation function becomes the minimum.

Figure 14:
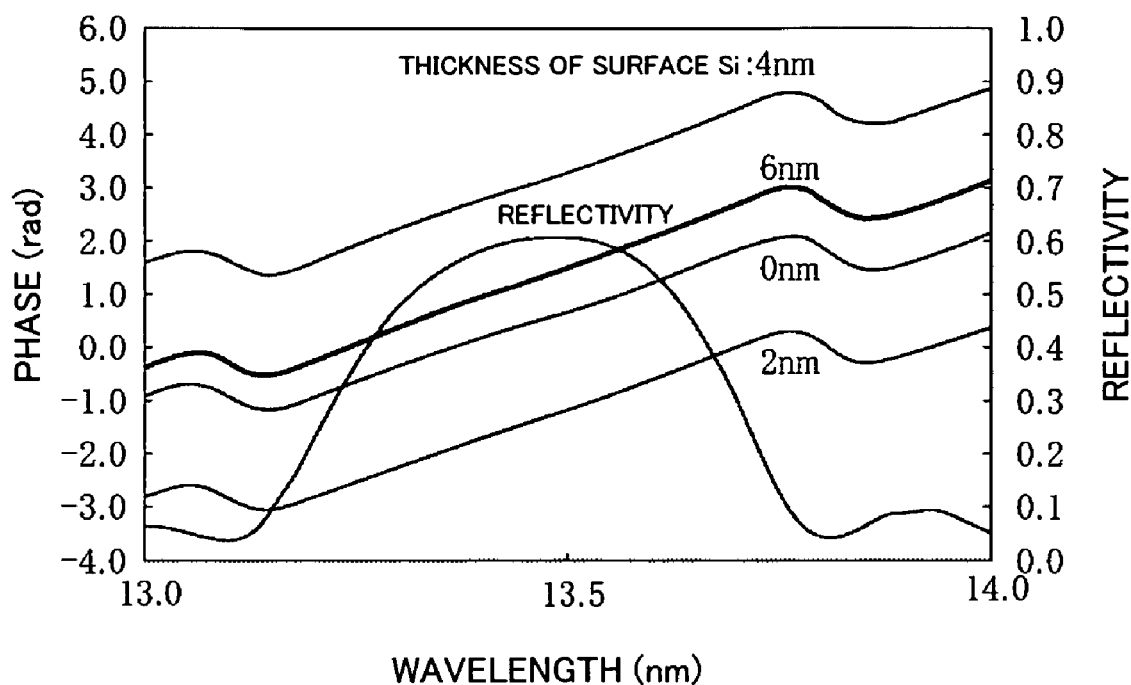
FIG. 14 is a graph of a relationship among a film thickness, wavelength, phase, and reflectivity by model calculation used for the second embodiment.

Thus, the calculation model that best reproduces the measurement value is decided. Next, the phase of the reflected light of the multilayer film is obtained from the decided model. This phase is assumed to be the measured phase difference between the incident light and the reflected light of the multilayer mirror ML. In the instant embodiment, the model that the thickness of the silicon of the top layer is 6 nm is the most corresponding to the measurement value shown in FIG. 12. The phase obtained from this model is FIG. 14.

The phase of each point on the multilayer film is measured by using this method, and the shape of equivalently reflection surface for the EUV light or the wave front of the reflected light when the EUV light is incident to this multilayer film can be obtained by adding the measurement result of the multilayer mirror shape.

The instant embodiment can obtain the phase difference between the incident light and the reflected light even if the wavelength dependency of the amount of the photoelectron discharged from the surface of the reference sample RS is not measured by comparing it with the model calculation, and the measurement is further simplified. Moreover, when the wavelength dependency of the amount of the photoelectron discharged from the surface of the reference sample RS is measured, the phase difference between the incident light and the reflected light may be obtained by comparing it with the model calculation. This method can obtain the phase difference between the incident light and the reflected light more precisely.

Third Embodiment

A description will be given of another more concretely method for obtaining "equivalent reflection surface" in the third embodiment.

Figure 15:
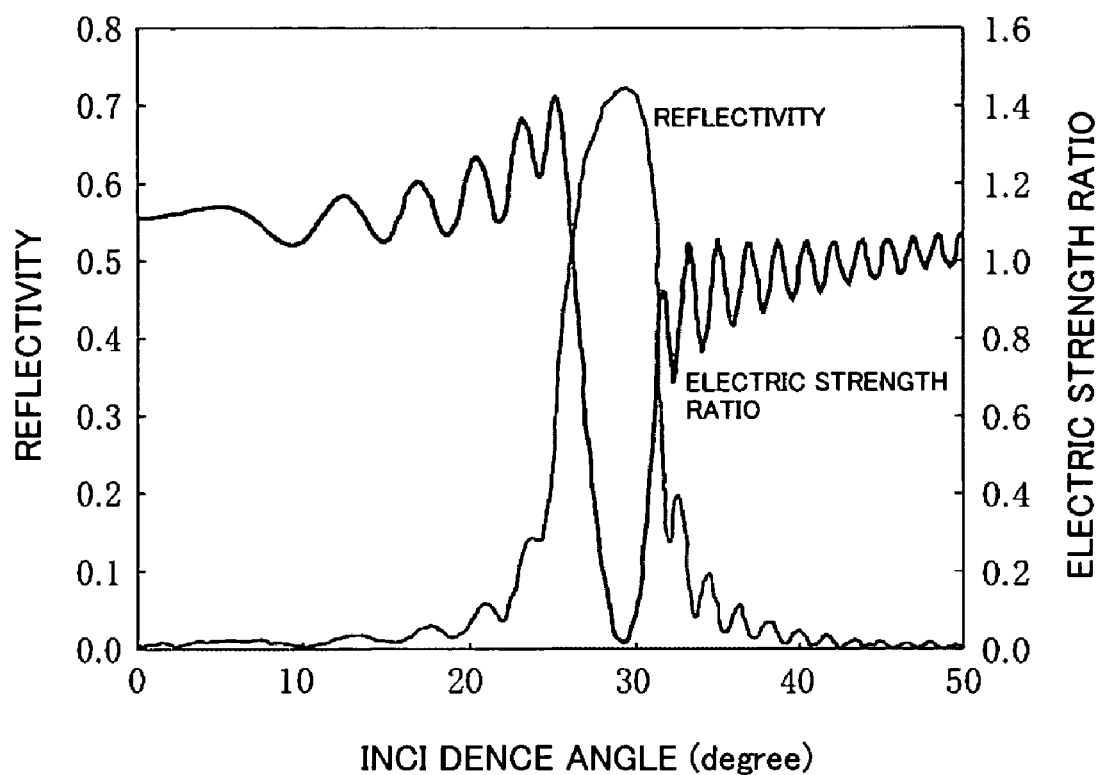
FIG. 15 is a graph of a relationship among an incidence angle, reflectivity, and electric field strength by model calculation used for the third embodiment.

In the instant embodiment, the EUV light is irradiated to the multilayer mirror ML, and the reflectivity of the EUV light and amount of the discharged photoelectron is measured at the same time. At this time, the reflectivity and the incidence angle dependency of the photoelectron amount are measured while changing the incidence angle of the EUV light relative to the sample. FIG. 15 shows an example of the measurement result. The coating thickness of the multilayer film that added molybdenum to silicon is 8 nm, and the wavelength of the EUV light is 13.5 nm. The phase difference is calculated by this result and Equation 15.

$$\cos \delta(\lambda) = (F(\lambda) - 1 - R(\lambda))/(2 \times R(\lambda)^{1/2}) \quad (15)$$

To convert electric filed strength from the discharged photoelectric amount, the reference sample RS is used as well as the first embodiment, or the discharged photoelectron amount is standardized by the discharge amount of the photoelectron at the incident angle with low reflectivity of the multilayer mirror ML, and the electric field strength ratio is obtained. The discharged amount of the photoelectron at the incidence angle about 0° or 50° is used and standardized for this example. Commutatively, the discharged amount of the photoelectron of one photon is almost constant in the wavelength bands not close to the wavelength of absorption edge of the material that composes the top layer of the multilayer film, so the wavelength is moved a little, and the discharged photoelectron amount may be standardized by the discharge amount of the photoelectron measured by wavelength which greatly lowers the reflectivity of the multilayer film.

The phase of each point on the multilayer film is measured by using this method, and the shape of equivalently reflection surface for the EUV light or the wave front of the reflected light when the EUV light is incident to this multilayer film can be obtained by adding the measurement result of the multilayer mirror shape.

Fourth Embodiment

A description will be given of another more concretely method for obtaining "equivalent reflection surface" in the fourth embodiment.

Figure 16:
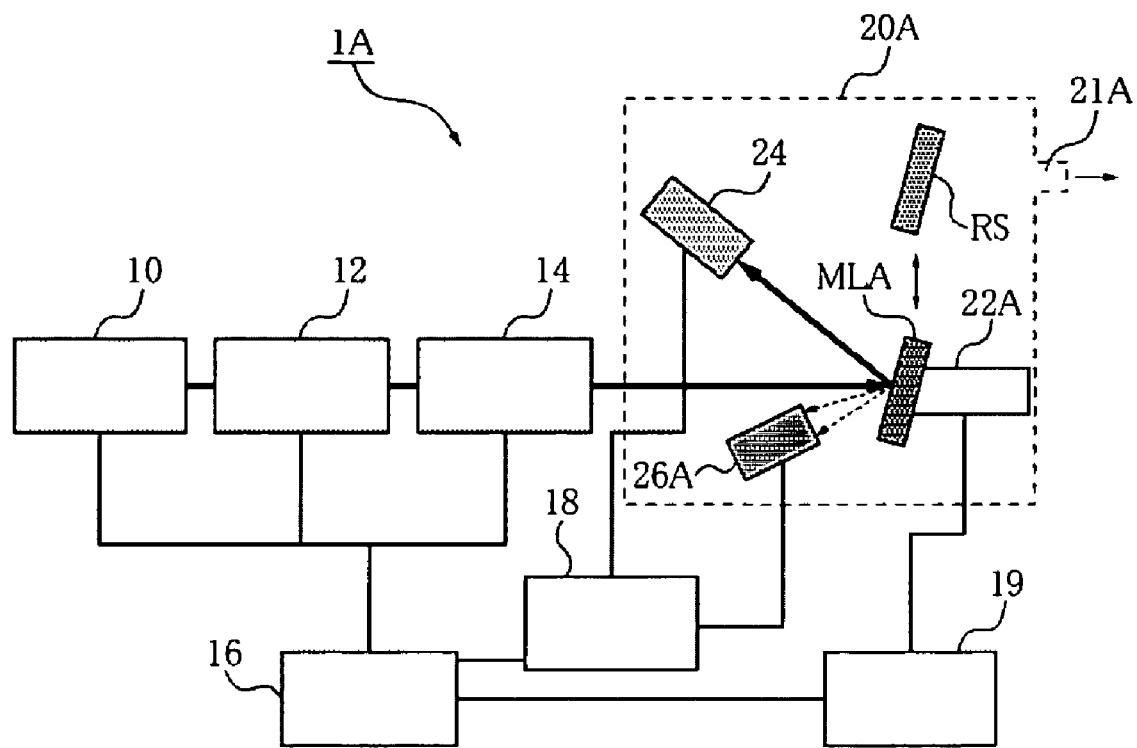
FIG. 16 is a block diagram of an equivalently shape change by a phase difference and a phase change between an incident light and reflected light of a multilayer mirror as another embodiment according to the present invention.

Referring now to FIG. 16, a description will be given of a measuring apparatus 1A of the instant embodiment. Here, FIG. 16 is a schematic block diagram of the measuring apparatus 1A of the instant embodiment. The measuring apparatus 1A of the instant embodiment is similar to the structure of the measuring apparatus 1 shown in first embodiment. However, a measuring room 20A has been exhausted to the ultra-high vacuum by the exhaust part 21 such as the vacuum pump etc. to prevent the attenuation of the EUV light and the absorption of the fluorescent X-ray, or the pollution adhering to the multilayer film surface. A detector 26A that detects the fluorescent X-ray is installed at near the multilayer mirror. The detector 26A uses a solid state detector (SSD), cooling SSD, and micro-calorimeter, etc. This detector may have a characteristic in which energy of the photon of fluorescent X-ray is classified. In other words, the detector measures the spectrum of fluorescent X-ray, or only light intensity of fluorescent X-ray in specific energy range.

A layer that consists of a specific material that differs from the material that composes the lower layer of the multilayer film is formed on the surface of the multilayer film sample. For example, the ruthenium layer with the thickness of plural ones nanometer is installed in the surface of the multilayer film that consists of the molybdenum and silicon. The solid state detector is set to the detected energy range to detect only peculiar characteristic X-ray from an element that composes the top layer.

The thin film that consists of ruthenium or carbon as a cap layer to prevent oxidation of the multilayer film and adhesion of contamination is formed on the top layer of the multilayer mirror. Therefore, the detected energy range is set to detect only the peculiar characteristic X-ray from the element that composes this layer.

The instant embodiment measures the phase of the reflected light according to the process similar to the first embodiment. In this case, the first embodiment measures the amount of the photoelectron discharged from the surface of the sample, but the instant embodiment measures the phase by measuring the amount of the fluorescent X-ray discharged from the surface of the sample. The solid state detector of the instant embodiment is set to the detected energy range to detect only peculiar characteristic X-ray to element that composes the top layer of the multilayer film, so the detected light intensity of the fluorescent X-ray is proportional to the electric field strength of the top surface of the multilayer film.

Fifth Embodiment

A description will be given of another more concretely method for obtaining "equivalent reflection surface" in the fifth embodiment.

Figure 5:
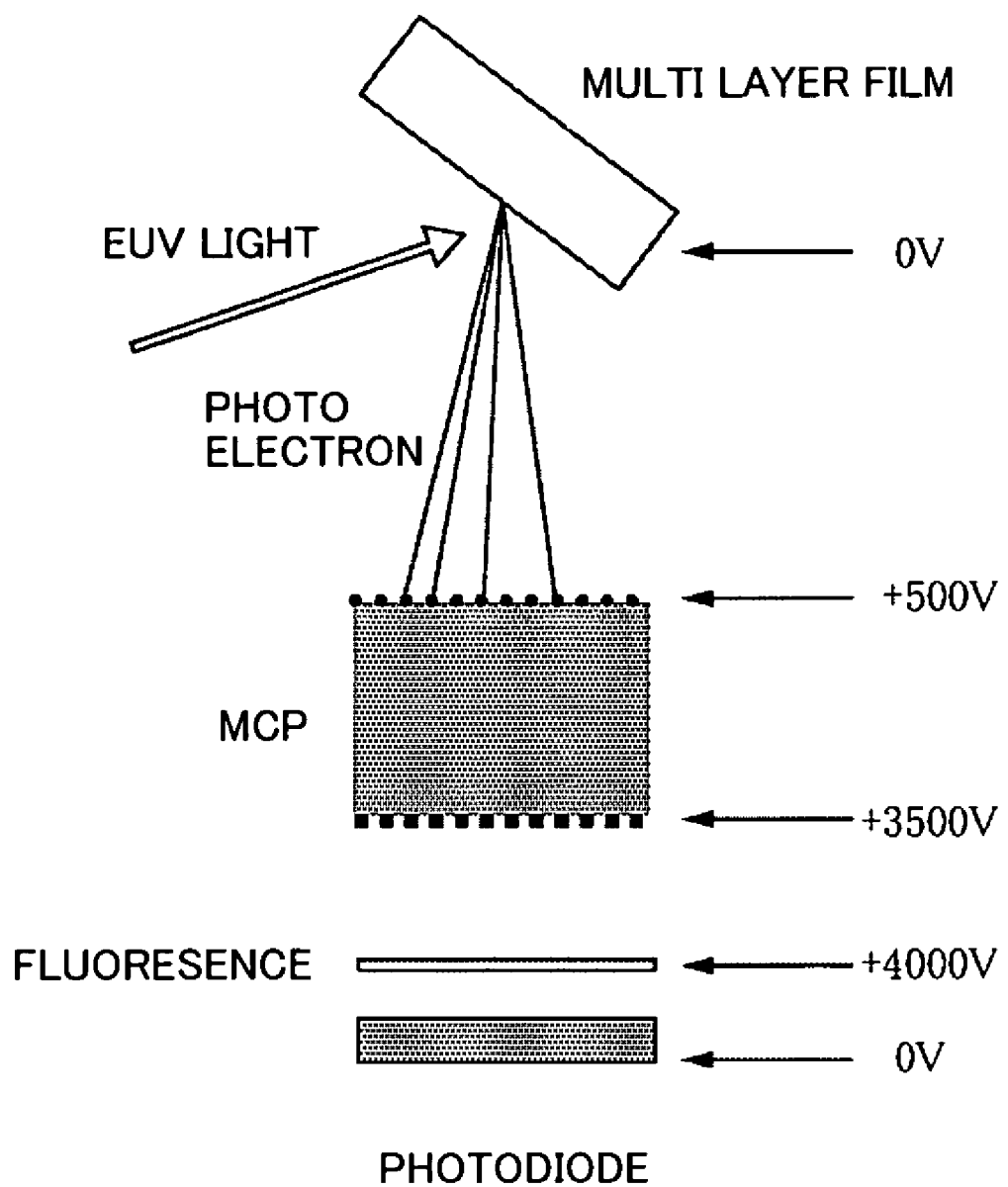
FIG. 5 is a typical view for measuring an electric field strength ratio of a multilayer film surface used for the instant embodiment.

The instant embodiment uses a similar measuring apparatus 1A shown in the fourth embodiment. The instant embodiment measures the photoelectron discharged from the multilayer film surface. The micro channel plate is used as a photoelectron detector as shown in FIG. 5. Here, FIG. 5 is a typical view for measuring the electric field strength ratio of the multilayer film surface. The EUV light is irradiated to the multilayer film sample, and the photoelectron discharged by the photoelectric effect is incidence to the MCP. To efficiently collect the photoelectrons, the voltage is applied to the surface of the incidence side of MCP to be the potential of the plus for the multilayer film (for instance, potential from about plus 100 to 500 volts).

A strong potential difference from about 2000 to 6000 volts is applied in the MCP for electron acceleration, amplifies an incidence electron from about 106 to 108, and is discharged from the exit side. This electron collides to a fluorescence board, maintained at a higher potential higher than the MCP exit side, and generates the fluorescence of visible light. This fluorescence is detected by the photodetector, for example, photodiode and photoelectron multiplier. The MCP exit side is maintained at a high positive voltage, and the fluorescence board is maintained at a higher positive voltage (for instance, about plus 3000 to 8000 volts to the multilayer film) to attract the electron. However, because the electron is converted into visible light by the fluorescence board, the photodetector can be set to an arbitrary potential. For example, the photodetector is maintained at the same potential as the multilayer film.

When the electron is detected while amplified, the output of the detector becomes a high voltage of the plus. Therefore, the technique for cutting the direct current at the condenser and inputting the only alternating current element that changes timewise is used to input it to the signal processing system. This method is effective to the pulse light source such as the laser plasma and the discharge plasma light source, etc. that changes timewise. However, when the consecutive timewise light such as the synchrotron radiation (SR) is used for the light source, this method to which direct current element is intercepted by the condenser cannot be used. When the fluorescence that generates by irradiating the electron output from MCP to the fluorescence board is detected by the photodetector, the photodetector can be maintained the same potential as the multilayer film. Therefore, there is an advantage that can be directly input to the signal processing system.

The instant embodiment measures the phase of the reflected light by using the measuring apparatus 1A according to the process similar to the second embodiment. Therefore, the detail is omitted.

Sixth Embodiment

A description will be given of another more concretely method for obtaining "equivalent reflection surface" in the sixth embodiment.

The instant embodiment irradiates the EUV light to the multilayer mirror ML, and measures the reflectivity of the EUV light and the amount of the fluorescent X-ray at the same time according to the process similar to the third embodiment. In this case, the third embodiment measures the amount of the photoelectron discharged from the surface of the sample, but the instant embodiment measures the phase by measuring the amount of the fluorescent X-ray discharged from the surface of the sample.

Seventh Embodiment

A description will be given of more concretely correcting method of the multilayer film in the seventh embodiment.

The instant embodiment executes the coating milling as a correction of the multilayer film.

The coating milling has been known as a method for correcting a surface shape of a plate in each multilayer mirror as proposed in "SUB-nm, Figure Error Correction of a Multilayer Mirror by Its Surface Milling", Masaki Yamamoto, Nuclear Instruments and Method in Physics Research A., 467-468 (2001), pp. 1282-1285. A description will be given of the coating milling with reference to FIGS. 17 to 22.

Figures 17A, 17B:
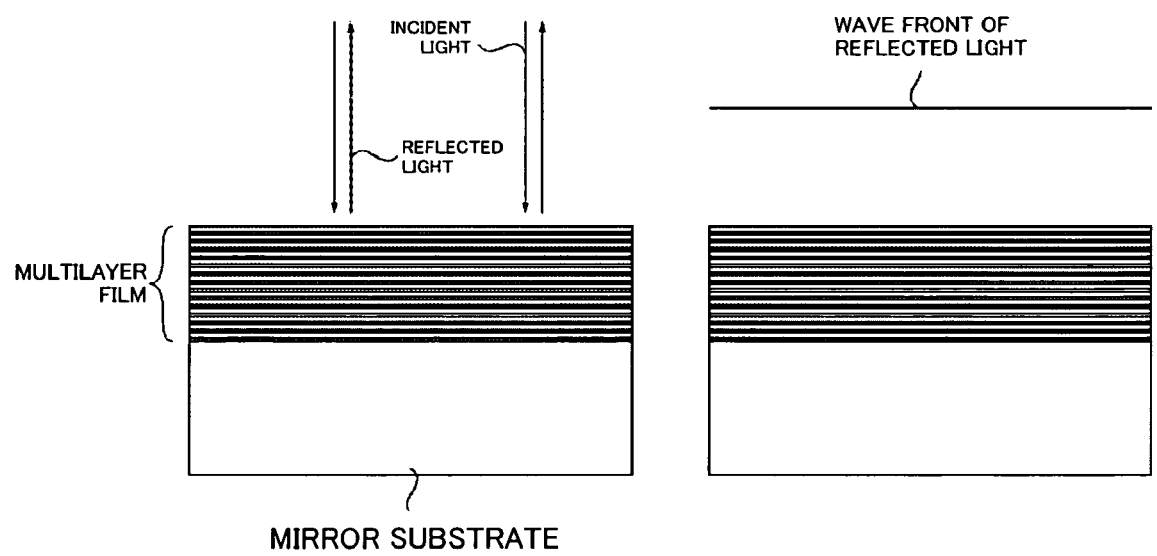
FIG. 17 is a view of a reflected light as which phase is the same.
Figures 18A, 18B:
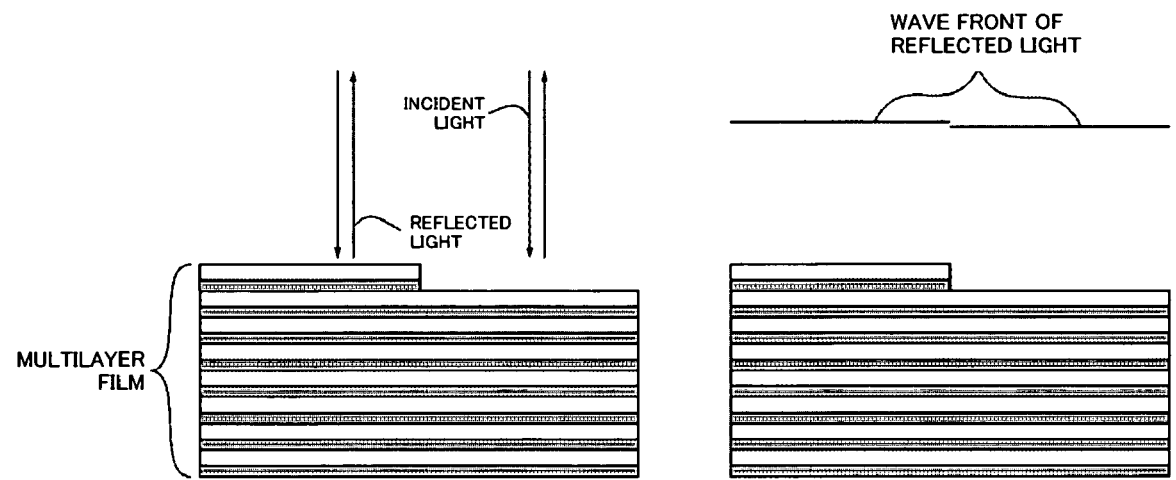
FIG. 18 is a comparison view of a wave front of a reflected light at a part where a couple of layer is different.

As shown in FIG. 17A, parallel light with an equal phase incident upon a multilayer mirror that uniformly forms a multilayer film on a mirror substrate would provide reflected light having a completely equal phase or reflected wave front as shown in FIG. 17B. On the other hand, as shown in FIG. 18A, wave front of the reflected light from part, at which one pair of films form unevenness on the multilayer film, forms a phase difference as shown in FIG. 18B.

Figure 19:
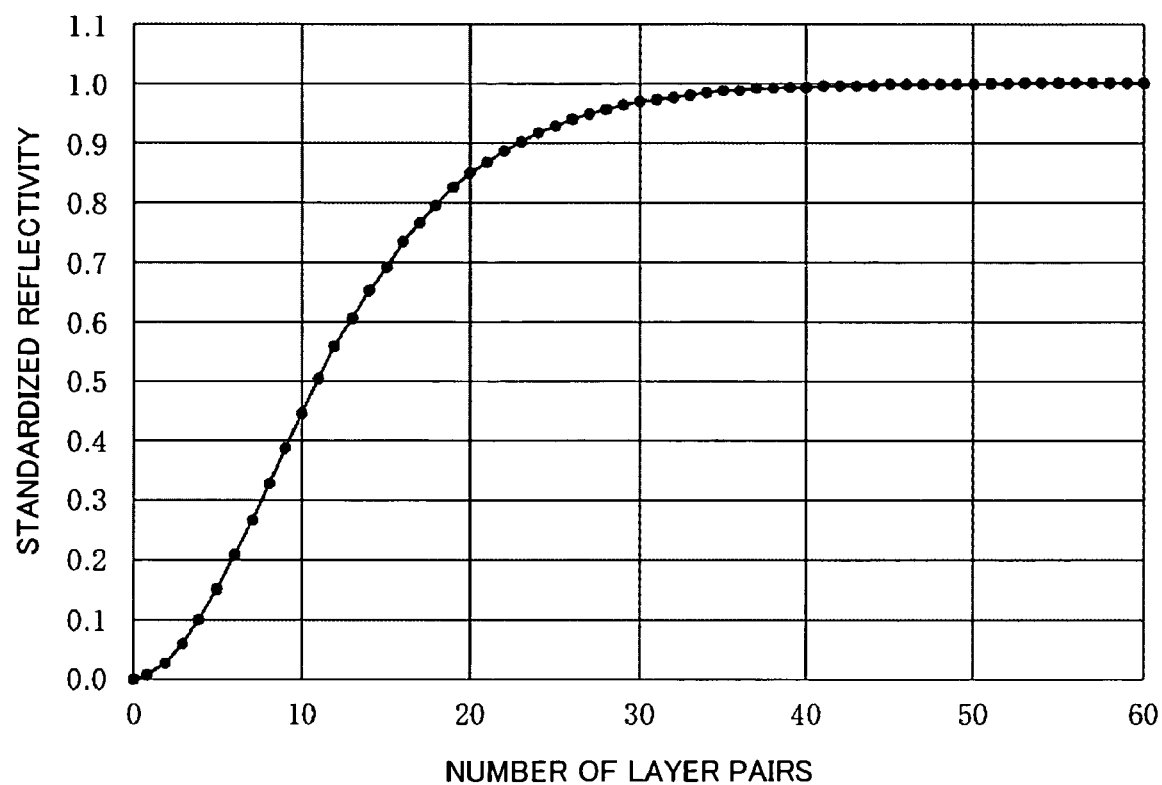
FIG. 19 is a graph of a relationship between a number of a coating cycle of a multilayer film and a reflectivity standardized by the maximum value.

The reflectance of the multilayer mirror depends upon the number of layer pairs of the multilayer film. FIG. 19 shows the number of layer pairs of the multilayer film and the reflectivity standardized by the maximum value. The reflectivity increases with the increased periodicity up to the forty layer pairs, and saturates above the forty layer pairs. If a multilayer film has been layered with sufficient periodicity, e.g., sixty layer pairs after the reflectance saturates, a difference in periodicity in the multilayer film would affect only a wave front.

It explains the case to incident the EUV light of 13.5 nm to a Mo/Si multilayer mirror that is formed by alternately forming or layering molybdenum and silicon at the incidence angle of 10°. The thickness of the Mo layer is about 3 nm, the thickness of the Si layer is about 4 nm, and the coating cycle is about 7 nm.

Figure 20A:
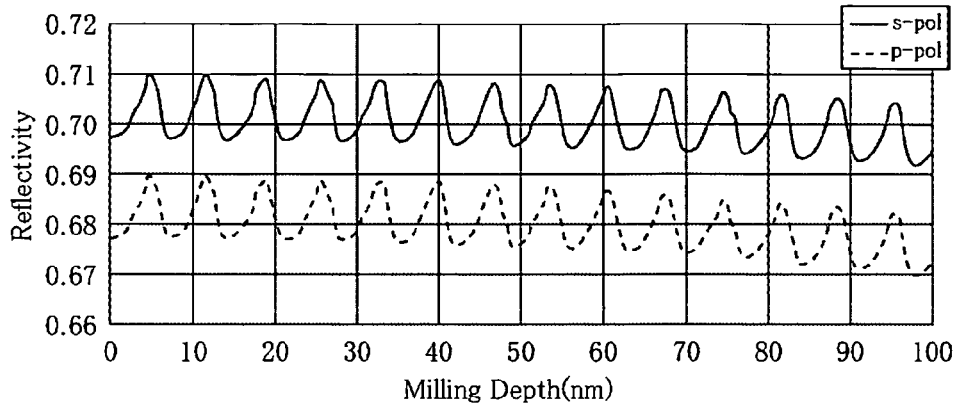
FIG. 20 is a graph of a relationship among a reflectivity, shift amount of a wave front or value in which the shift amount of the wave front is converted into a shift of spatial reflection position, and milling depth.
Figure 20B:
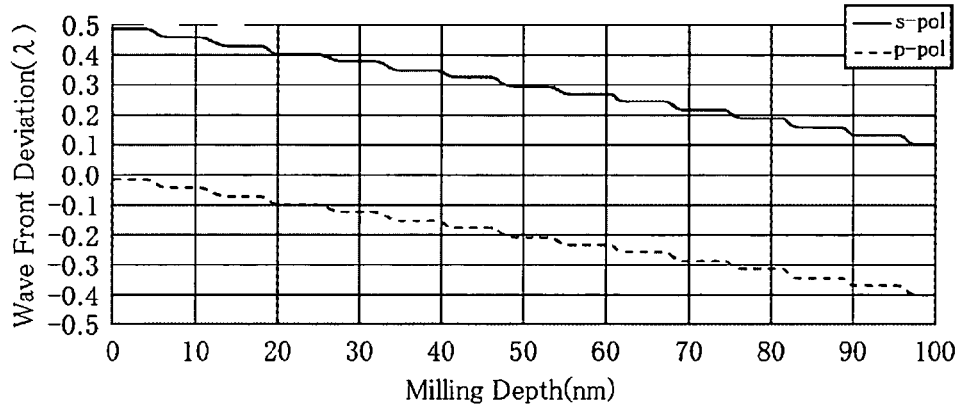
Figure 20C:
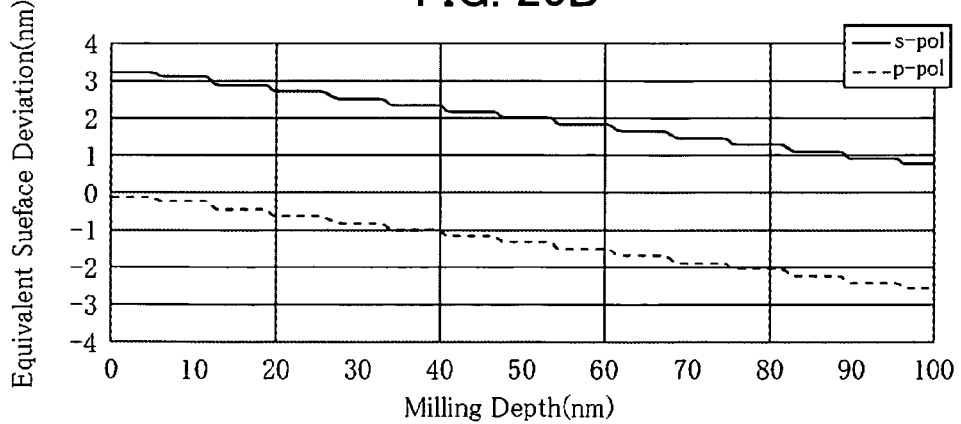

Suppose that the multilayer film is removed from its top layer while the top layer is set to be an origin in the multilayer film. The removal amount from the multilayer film is called a milling depth. FIG. 20A is a graph of a relationship between the milling depth and reflectivity, while FIG. 20B shows a graph between the milling depth and the wave front shift amount, when the EUV light of 13.5 nm is incident at an angle of 10° upon a Mo/Si multilayer mirror. In general, a Mo/Si multilayer arranges the Si layer as the top layer to reduce the influence of the oxidization of Mo, and the instant embodiment has calculated on the assumption that the Si layer is located as the top layer. It is understood from FIGS. 20A and 20B that as one layer pair of 6.99 nm is removed from the multilayer film, the wave front of the reflected light moves by about 0.025 wavelength. FIG. 20C shows a graph that converts a shift amount of wave front into a shift amount of a spatial reflection position. The shift amount L of a spatial reflection position is given in $\lambda \times W = 2L$, where $\lambda$ is a wave front of incident light and W is a shift amount of wave front. A removal of one layer pair of 6.99 nm from the multilayer film means about 0.2 nm movement of the reflected position in the instant embodiment. As understood from FIG. 20A, the coating milling changes the index and wave front in the Mo layer more greatly than those in the Si layer due to a relationship of reflectivity. As above-mentioned, as the reflectivity saturates for the periodicity of a multilayer film that has about sixty layer pairs, a removal of one layer pair would change the wave front without changing the reflectivity.

Use of a relationship described with reference to FIGS. 17 to 20 would easily correct about 0.2 nm by a removal of one layer pair of 6.99 nm from the multilayer film. This is called the coating milling.

Figure 21A:
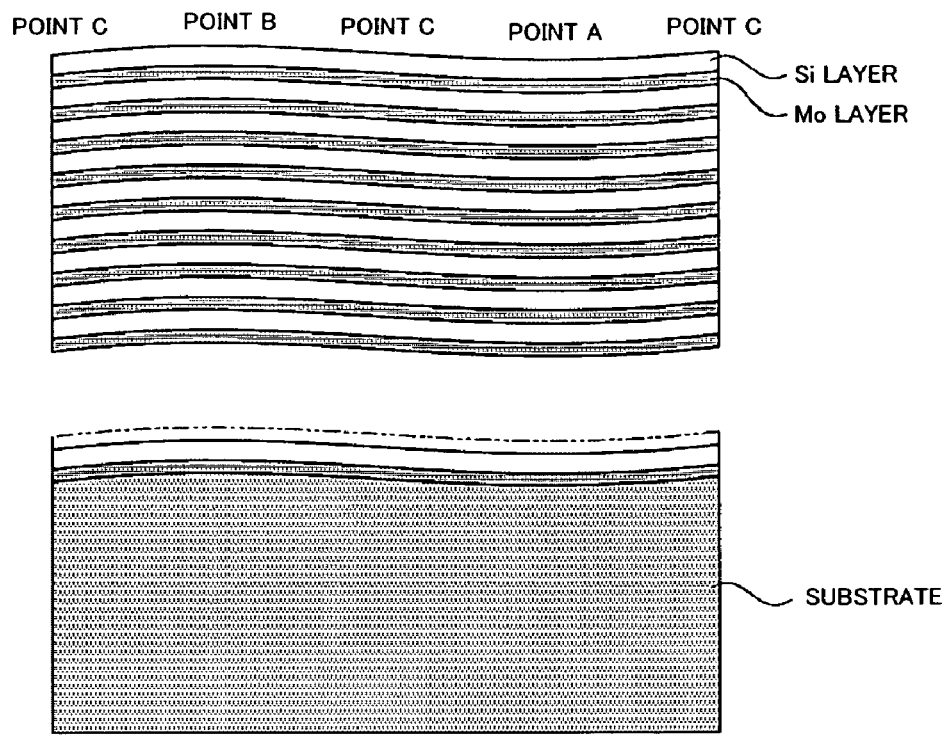
FIG. 21 is a view for explaining correcting method of wave front aberration that originates in a figure error of a mirror substrate.
Figure 21B:
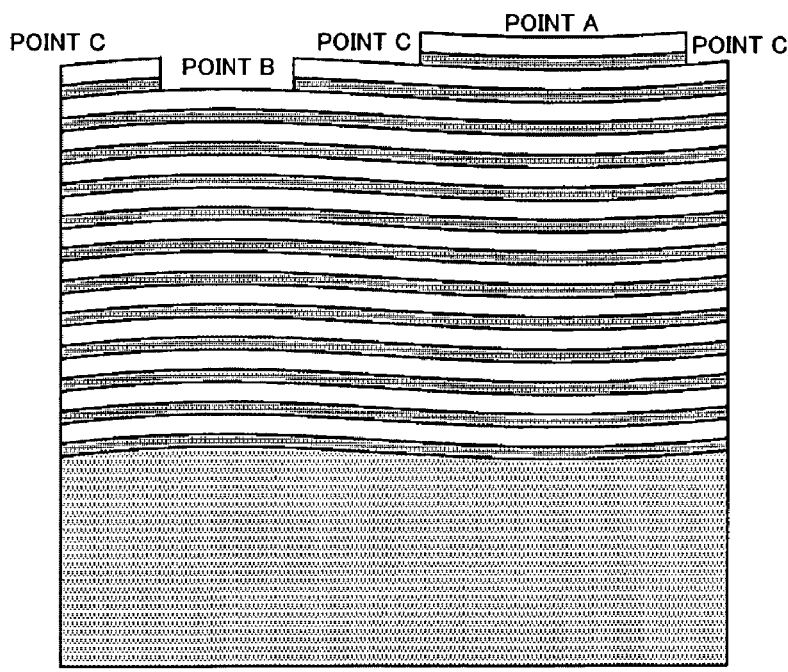

For example, suppose as shown in FIG. 21A, a multilayer mirror that uniformly forms a multilayer film on a distorted mirror substrate. The coating milling is an approach to delay a phase, and applied to a point A as an origin having the latest phase. The Si layer changes the wave front slightly, whereas the Mo layer changes the wave front greatly and, as above-mentioned, is highly vulnerable to oxidization. Therefore, without special coating, it is not desirable to finish coating milling in the middle of the Mo layer and continuously adjust the wave front. As shown in FIG. 21B, the wave front is adjusted discontinuously by removing every layer pair of Mo and Si. On the other hand, since the Si layer has resistance to oxidation and does not affect the wave front, the coating milling may end in the middle of the Si layer. As above-mentioned, when the EUV light of 13.5 nm is incident at an angle of 10°, a removal of one layer pair of 6.99 nm from the multilayer film may easily correct the spatial reflection position or a figure error of the mirror substrate every 0.2 nm.

Referring to FIGS. 21A and 21B, when a surface shape of the mirror substrate has a figure error of 0.4 nm at a point B and a figure error of 0.2 nm at a point C viewed from the point A, the wave front aberration caused by the figure error of the mirror substrate may be corrected by removing two layer pairs from the multilayer film at the point B and one layer pair from the multilayer film at the point C.

Figure 22A:
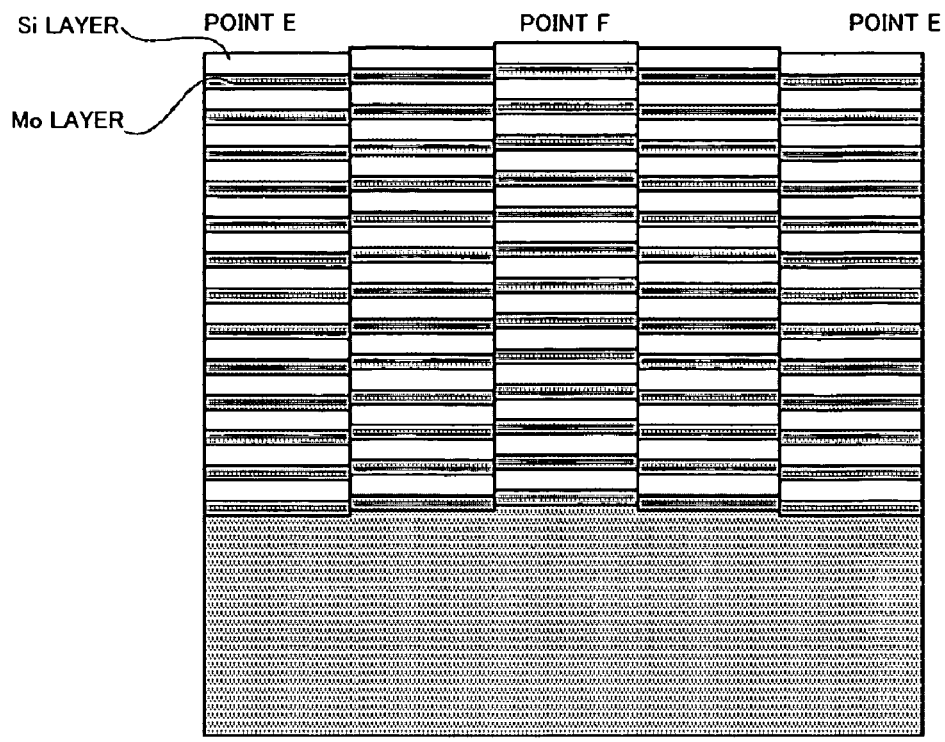
FIG. 22 is a view for explaining correcting method of wave front aberration that originates in a figure error of a mirror substrate.
Figure 22B:
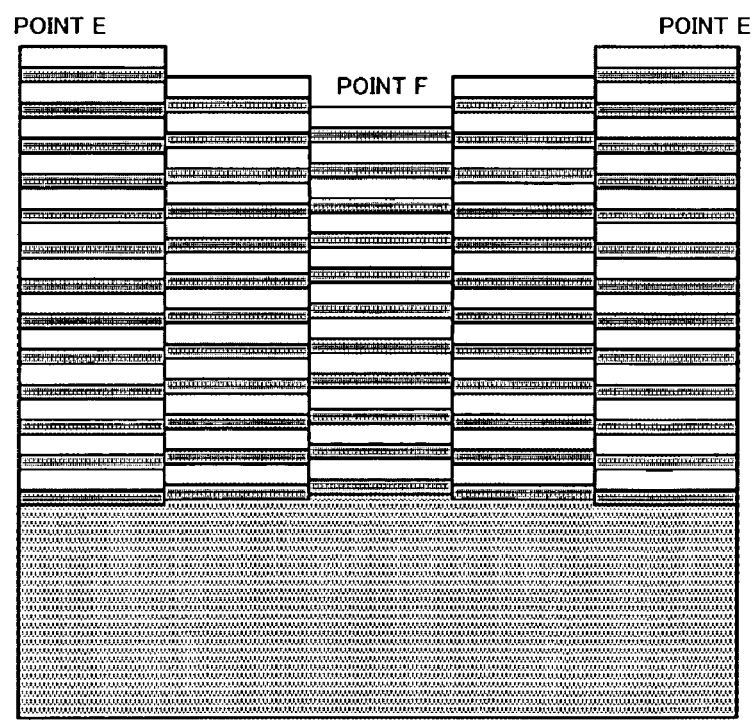

Similarly, as shown in FIG. 22A, for example, suppose a multilayer mirror that uniformly forms a multilayer film on a mirror substrate that has a point F at a center part above a point E on the edge. Since the point E has relatively the latest phase in the multilayer mirror, the coating milling is applied to a point E as an origin. Referring to FIGS. 22A and 22B, when the mirror substrate has a figure error of about 0.4 nm between the edge point E and the center point F, and the figure error changes continuously, two layer pairs are removed from the multilayer film at the center point F. The wave front aberration caused by the figure error may be corrected by removing one layer pair at both sides.

The instant embodiment explained the correcting method of the multilayer film when the substrate has the figure error. However, this method is similarly applicable when the "equivalent reflection surface" has the figure error.

When the error from the design value of the EUV reflection wave front calculated in step 1006 of FIG. 3 is outside the tolerance, the multilayer film correcting method of the instant embodiment is used to decrease the error. Therefore, an optical element that has a multilayer film with a desired performance can be easily fabricated.

There is an ion beam etching apparatus as an apparatus that can apply the coating milling and remove thin film. A description will be given of the ion beam etching apparatus. The ion beam apparatus irradiates the ion beam accelerated at a plasma generation room to the mirror, and etches a target etching film (multilayer film). Because the ion beam etching can be controlled comparatively easily because it is controlled electrically. Moreover, the ion beam etching is a dry process, pollutes very little, and influences other mirror parts very little. Directionality is good, and the partial etching is possible by forming a shield part using a masking plate.

Moreover, if it is the dry process of a sputtering etching etc., besides the ion beam etching, the etching of the multilayer film is possible.

A correcting apparatus that corrects the optical element having the multilayer film can be composed by combining the above measuring apparatus with the etching apparatus. The correcting apparatus can execute the EUV wave front measurement and the correcting method of the instant embodiment, and facilitates the correction of the optical element that has the multilayer film.

Eighth Embodiment

Next, a description will be given of other correcting method of the multilayer film.

The instant embodiment uses a method of adding the film to the multilayer film as the correcting method of the multilayer film.

The shift W of the reflection phase of EUV light for each unit length and the shift L of the reflection phase of EUV light that moves by adding the thickness d are given in Equations 16 and 17 respectively, where the wavelength of the incident light is $\lambda$, the index is n, and the adding thickness is d.

$$W = (4\pi/\lambda) \times (1/n) \quad (16)$$

$$L[\text{radian}] = (4\pi/\lambda) \times (1/n)d \quad (17)$$

The best thickness of an addition film is decided based on Equations 16 and 17. For instance, ruthenium is used as a material of the addition film.

When the error from the design value of the EUV reflection wave front calculated in step 1006 of FIG. 3 is outside the tolerance, the multilayer film correcting method of the instant embodiment is used to decrease the error. Therefore, an optical element that has a multilayer film with a desired performance can be easily fabricated.

A correcting apparatus that corrects the optical element having the multilayer film can be composed by combining the above measuring apparatus with the deposition apparatus. The correcting apparatus can execute the EUV wave front measurement and the correcting method of the instant embodiment, and facilitates the correction of the optical element that has the multilayer film.

Ninth Embodiment

Next, a description will be given of another correcting method of the multilayer film.

The instant embodiment uses a phase correcting method that changes a film structure by heating the film with the electron beam as a method of correcting the multilayer film.

An electron beam irradiating apparatus is used as a heat source. The beam with a predetermined energy is irradiated to the corrected place on the reflection wave front, the film structure is changed, and the phase is corrected.

When the error from the design value of the EUV reflection wave front calculated in step 1006 of FIG. 3 is outside the tolerance, the multilayer film correcting method of the instant embodiment is used to decrease the error. Therefore, an optical element that has a multilayer film with a desired performance can be easily fabricated.

A correcting apparatus that corrects the optical element having the multilayer film can be composed by combining the above measuring apparatus with the electron beam irradiating apparatus. The correcting apparatus can execute the EUV wave front measurement and the correcting method of the instant embodiment, and facilitates the correction of the optical element that has the multilayer film.

Tenth Embodiment

Next, a description will be given of another correcting method of the multilayer film.

The instant embodiment uses a method that gives a deformation by adding a power from the outside to the multilayer mirror substrate. Therefore, the instant embodiment adds the power to the multilayer mirror substrate and deforms the substrate, consequently, corrects the multilayer film by deforming the multilayer film.

Figure 23:
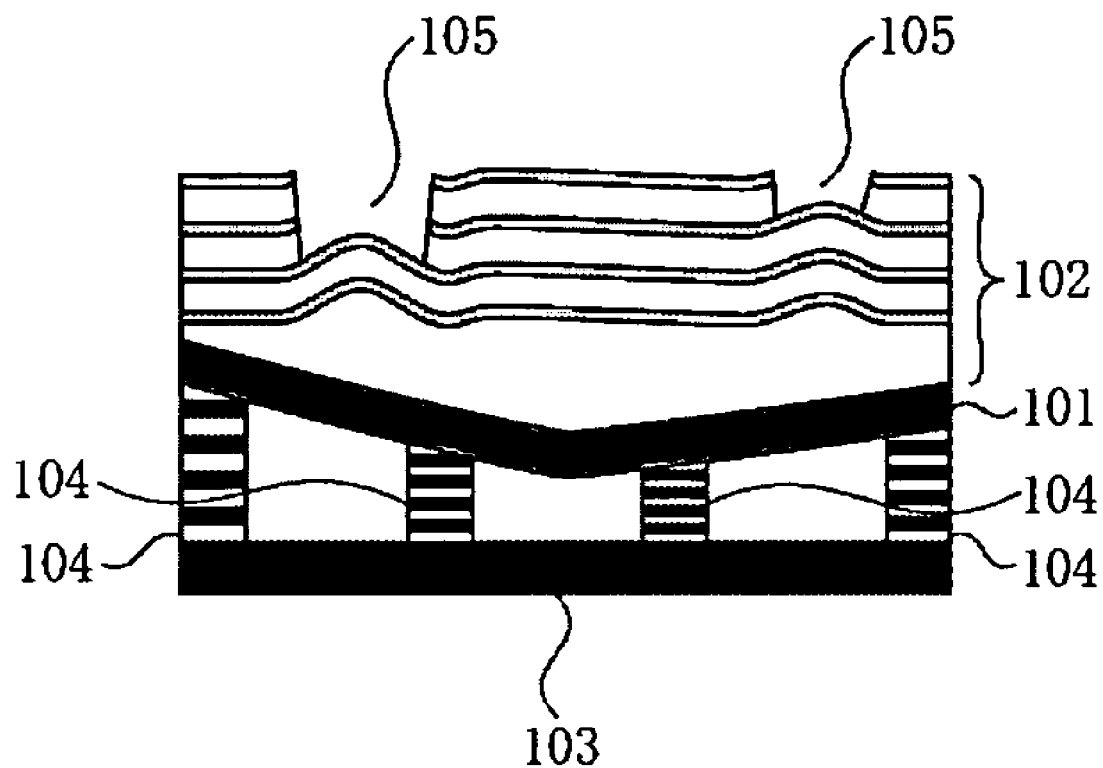
FIG. 23 is a view of a multilayer mirror to which a deformation is added by a piezo electric element.

FIG. 23 is a view of a situation to correct a deformation of the substrate by an actuator and above coat milling. A multilayer film 102 is formed to a substrate 101, and an actuator 104 that transforms the substrate is arranged between the substrate 101 and a high rigidity member 103. The member 103 and the actuator 104 are installed before or after the multilayer film is formed.

For instance, a piezo-electric element is suitable as the actuator 104. The piezo-electric element can control minute displacement, and can enlarge the displacement amount by piling up like the stack. A micro-moving mechanism may be composed when the piezo-electric element and a hinge spring are combined.

The number of piezo elements changes in the transformed degree etc. In the instant embodiment, four piezo-electric elements are arranged at a section position of the direction of the diameter to correct the deformation of degree as size of the mirror with the same cycle. Actually, the piezo-electric elements are arranged along the entire curved surface, but figure is omitted.

The member 103 is installed in consideration of the transformation when the member is installed. The surface is polished with the voltage not added to the piezo-electric element, and is polished until the error from the designed surface becomes about 5 nm. The polishing with the accuracy of the error of about 5 nm can be achieved comparatively easily.

When the error from the design value of the EUV reflection wave front calculated in step 1006 of FIG. 3 is outside the tolerance, the multilayer film correcting method of the instant embodiment is used to decrease the error. Therefore, an optical element that has a multilayer film with a desired performance can be easily fabricated.

Embodiment of the Exposure Apparatus

Figure 2:
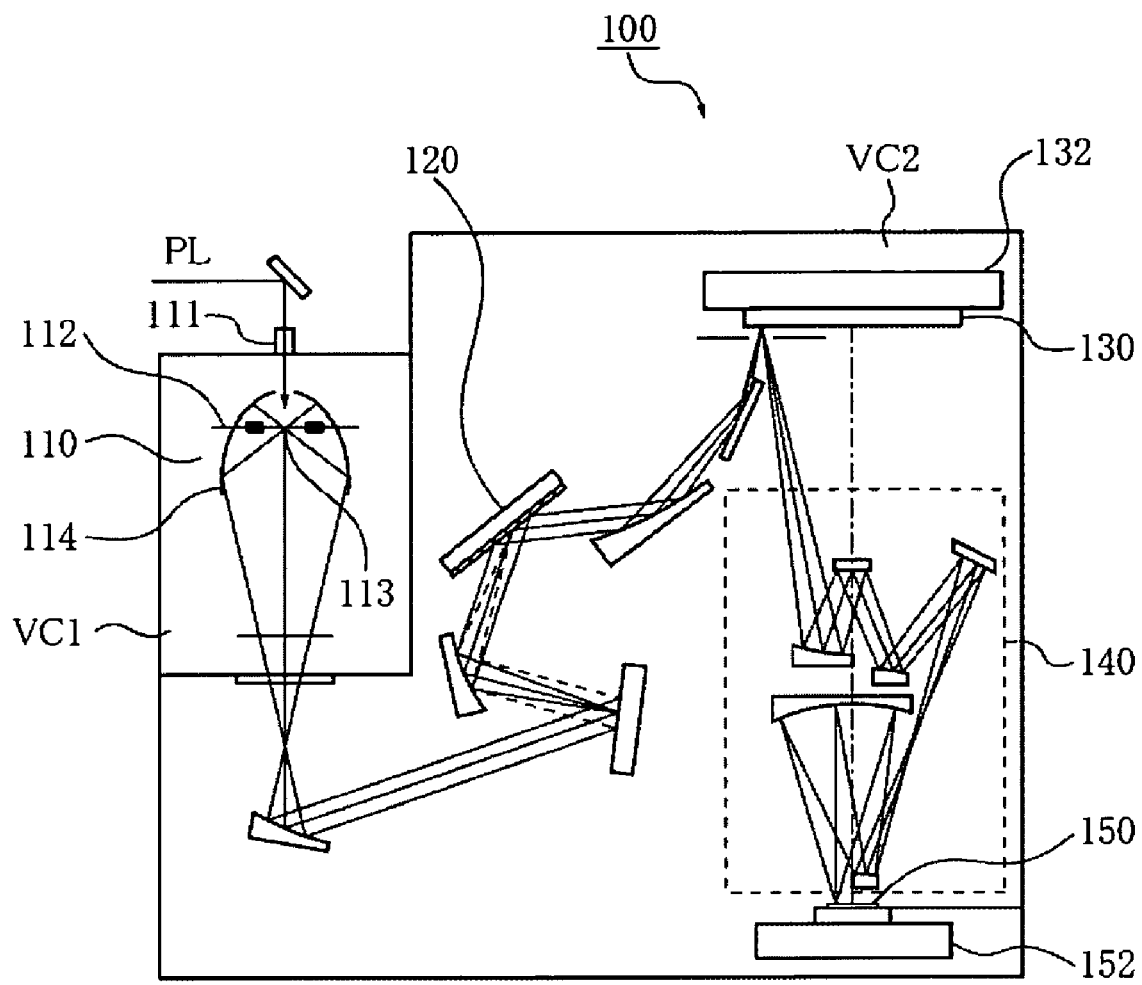
FIG. 2 is a schematic view of a EUV exposure apparatus of the instant embodiment.

Referring now to FIG. 2, a description will be given of a EUV exposure apparatus 100 of the present invention. FIG. 2. is a schematic sectional view of the EUV exposure apparatus. The EUV exposure apparatus 100 is a projection exposure apparatus that uses, as illumination light for exposure, EUV light (e.g., with a wavelength of 13.5 nm) to perform a step-and-scan exposure that transfers a circuit pattern on a reticle onto an object to be exposed. Referring to FIG. 2, the EUV exposure apparatus 100 includes a EUV light source part 110, an illumination optical system 120, a reflection-type mask (reflection-type reticle) 130, a mask stage 132, a projection optical system 140, a wafer 150, and a wafer stage 152. A vacuum chamber VC2 houses the illumination optical system 120 to the wafer stage 152.

The EUV light source part 110 irradiates a highly intensified pulse laser light PL to a target material supplied from a target supply system 112 arranged in a vacuum chamber VC1 and put in a condenser point position 113, via a condenser optical system (not shown) from a laser light source (not shown), thus generating high-temperature plasma for uses as EUV light with a wavelength of about 13.5 nm emitted from this. The EUV light source part 110 excites the target material to high-temperature plasma by irradiating a high-luminance excitation pulse laser to the target material, corrects the EUV light from the light with a wavelength band from infrared, ultraviolet to EUV light that is isotropically irradiated from the plasma when the plasma is cooled by a condenser mirror 114, and uses this as the exposure light.

The pulse laser PL uses, for example, Nd:YAG laser or excimer laser. The vacuum chamber VC1 maintains a vacuum atmosphere environment for the EUV light with a small transmittance to the atmosphere is small. The pulse laser is condensed in the condenser point position 113 through a window 111 installed in the vacuum chamber VC1. The target material depends on the wavelength of the generated EUV light, uses a metallic thin film such as copper (Cu), lithium (Li), and zinc (Zn) etc., an inert gas such as xenon (Xe) etc., and a liquid drop, etc., and is supplied to the vacuum chamber VC1 by the target supply system 112 such as a gas jet. The target supply system 112 has a target recover system that recovers a remained target material because all of the supplied target material does not contribute to the plasma.

The EUV light introduced into the vacuum chamber VC2 illuminates the mask 130 that has a predetermined pattern through the illumination optical system 120. The illumination optical system 120 leads the EUV light, and illuminates the mask 130. The illumination optical system 120 includes a plural mirror, an optical integrator, and an aperture. The optical integrator serves to uniformly illuminate the mask with a predetermined NA. The aperture is arranged in a conjugate position for the mask 130, limits an illumination area to an arc shape on the mask 130.

The EUV light selectively reflected by the reflection-type mask 130 is projected onto the wafer 150 that a photoresist applied by the projection optical system 140 composed of the plural reflection mirror, and transfers the pattern of the mask 130 to the wafer 150.

The illumination area of the mask 130 and a projection image of the wafer 150 are limited within an arc shape area of extremely narrow same image height to obtain an excellent image that suppresses aberration of the projection optical system 140. Then, the exposure apparatus 100 adopts the scanning exposure method that exposes by synchronously scanning the mask stage 132 and the wafer 152 to expose all patterns formed in the mask 130 to the wafer 150.

The condenser mirror 112, the illumination optical system 120, the reflection-type mask 130, and the projection optical system 140 have the multilayer film of Mo and Si on the substrate to efficiently reflect the EUV light, and the surface roughness requires 0.1 nm on standard deviation to suppress a decrease of the reflectivity. Moreover, the reflection mirror of the projection optical system requires the shape precision of 0.1 nm on standard deviation in addition to above surface roughness, and needs an extremely high precision optical system. The optical element fabricated by the fabrication method of the present invention is applied to such the optical element. Therefore, the exposure apparatus of the instant embodiment can be exposed in high accuracy.

Embodiment of the Device Fabrication Method

Figure 24:
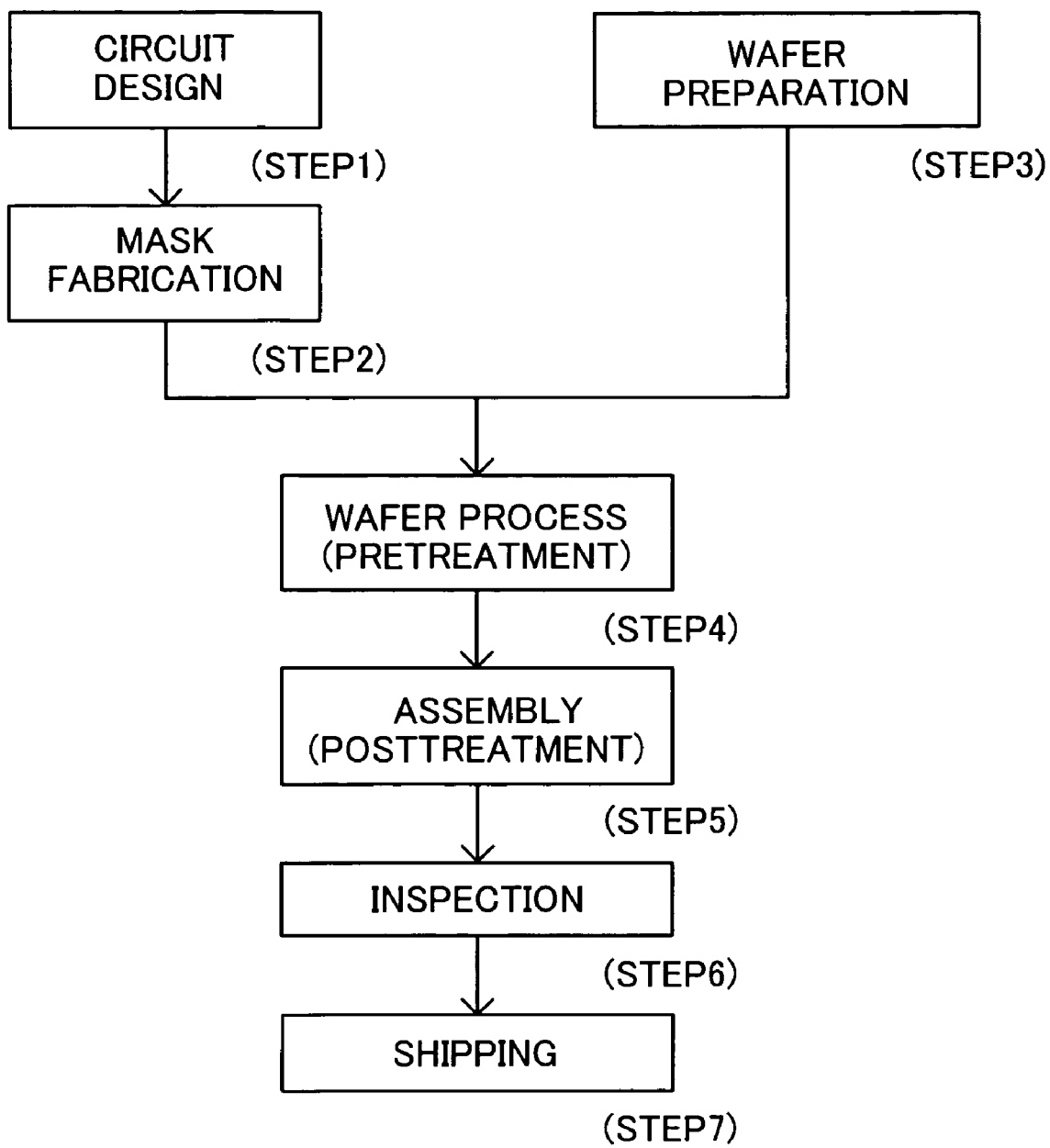
FIG. 24 is a flowchart for explaining how to fabricate devices (such as semiconductor chips such as ICs, LCDs, CCDs, and the like).
Figure 25:
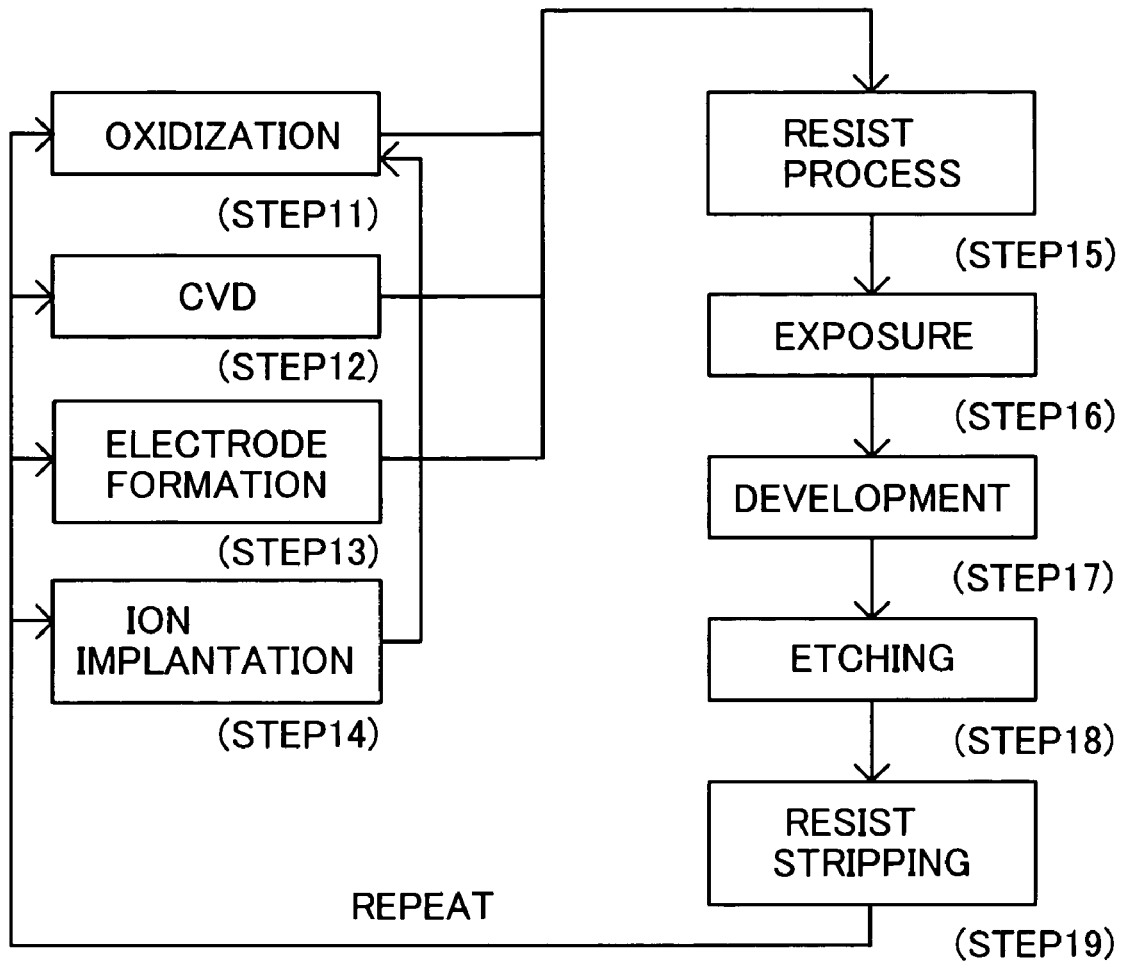
FIG. 25 is a detailed flowchart of a wafer process in Step 4 of FIG. 24.

Referring now to FIGS. 24 and 25, a description will be given of an embodiment of a device fabrication method using the above mentioned exposure apparatus 100. FIG. 24 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 25 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. Use of the fabrication method in this embodiment helps fabricate higher-quality devices than conventional methods. Thus, the device fabrication method using the exposure apparatus 100, and resultant devices constitute one aspect of the present invention.

Furthermore, the present invention is not limited to these preferred embodiments and various variations and modifications may be made without departing from the scope of the present invention.

Thus, a fabrication method of optical element of the present invention can easily fabricate an optical element that has a mulitlayer film with a desired performance.

This application claims foreign priority benefits based on Japanese Patent Applications No. 2004-139060, filed on May 7, 2004, which is hereby incorporated by reference herein in its entirety as if fully set forth herein.

What is claimed is:

1. A fabrication method of an optical element having a multilayer film comprising the steps of:
   forming a multilayer film on a substrate,
   measuring a secondary radiation radiated from the multilayer film when a light with a wavelength of 2 to 40 nm is irradiated to the multilayer film,
   determining a phase difference between the light irradiated to the multilayer film and the light reflected from the multilayer film based on a measurement result of the measuring step; and
   modifying the multilayer film based on the determined phase difference.

2. A fabrication method according to claim 1, further comprising the steps of measuring a surface shape of the optical element,
   wherein the modifying step acquires a wave front of the light reflected by the optical element based on the determined phase difference and the measurement result of the measuring step, and corrects the multilayer film according to the wave front.

3. A fabrication method according to claim 1, wherein the modifying step removes a part of the multilayer film.

4. A fabrication method according to claim 1, wherein the modifying step adds a film on a part of the multilayer film.

5. A fabrication method according to claim 1, wherein the modifying step applies a heat to the multilayer film.

6. A fabrication method according to claim 1, wherein the modifying step deforms the multilayer film.

7. A modification apparatus of an optical element having a multilayer film comprising:
   a irradiating optical system for irradiating the multilayer film using a light with a wavelength of 2 to 40 nm,
   a detector for detecting a secondary radiation radiated from the multilayer film by irradiating the light to the multilayer film,
   a modification part for modifying the multilayer film; and
   a controller for determining a phase difference between the light irradiated to the multilayer film and the light reflected from the multilayer film based on a detection value of the detector, and controlling the modification part based on the determined value.

8. A modification apparatus according to claim 7, wherein the modification part removes a part of the multilayer film.

9. A correction apparatus according to claim 7, wherein the modification part adds a film on a part of the multilayer film.

10. A modification apparatus according to claim 7, wherein the modification part applies a heat to the multilayer film.

11. An exposure apparatus comprising:
    a projection optical system for projecting a pattern of a reticle onto an object, the projection optical system includes an optical element having a multilayer film fabricated by a fabrication method,
    wherein the fabrication method includes the steps of:
    forming the multilayer film on a substrate,
    measuring a secondary radiation radiated from the multilayer film when a light with a wavelength of 2 to 40 nm is irradiated to the multilayer film,
    determining a phase difference between the light irradiated to the multilayer film and the light reflected from the multilayer film based on a measurement result of the measuring step; and
    modifying the multilayer film based on the determined phase difference.

12. A device fabrication method comprising the steps of:
    exposing an object using an exposure apparatus; and
    performing a development process for the object exposed,
    wherein the exposure apparatus includes:
    a projection optical system for projecting a pattern of a reticle onto the object, the projection optical system includes an optical element having a multilayer film fabricated by a fabrication method,
    wherein the fabrication method includes the steps of:
    forming the multilayer film on a substrate,
    measuring a secondary radiation radiated from the multilayer film when a light with a wavelength of 2 to 40 nm is irradiated to the multilayer film,
    determining a phase difference between the light irradiated to the multilayer film and the light reflected from the multilayer film based on a measurement result of the measuring step; and
    modifying the multilayer film based on the determined phase difference.

* * * * *